US012660475B2

(12) United States Patent
Liu et al.

(10) Patent No.: US 12,660,475 B2
(45) Date of Patent: Jun. 16, 2026

(54) LIGHT EMITTING DEVICE, ELECTRONIC APPARATUS, CONTROL APPARATUS, AND LIGHT EMITTING CONTROL METHOD

(71) Applicant: HUAWEI TECHNOLOGIES CO., LTD., Shenzhen (CN)

(72) Inventors: Yongjun Liu, Beijing (CN); Liang Yang, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 142 days.

(21) Appl. No.: 18/215,310

(22) Filed: Jun. 28, 2023

(65) Prior Publication Data

US 2023/0363199 A1     Nov. 9, 2023

Related U.S. Application Data

(63) Continuation of application No. PCT/CN2020/142492, filed on Dec. 31, 2020.

(51) Int. Cl.
| | |
|---|---|
| *H10K 59/80* | (2023.01) |
| *H05B 45/60* | (2022.01) |
| *H10K 50/85* | (2023.01) |
| *H10K 50/80* | (2023.01) |

(52) U.S. Cl.
CPC ....... *H10K 59/80522* (2023.02); *H05B 45/60* (2020.01); *H10K 50/85* (2023.02); *H10K 59/805* (2023.02); *H10K 50/868* (2023.02)

(58) Field of Classification Search
CPC ........ H05B 45/40; H05B 45/60; H10K 50/85;

H10K 50/868; H10K 59/805; H10K 59/80522; H10K 85/40; H10K 85/633; H10K 85/654; H10H 20/83; H10H 20/811

See application file for complete search history.

(56) References Cited

U.S. PATENT DOCUMENTS

| | | | | |
|---|---|---|---|---|
| 2009/0108737 A1* | 4/2009 | Kwong | ................... | H05B 33/14 546/4 |
| 2009/0179554 A1* | 7/2009 | Kuma | .................... | H10K 50/19 313/504 |
| 2009/0284161 A1* | 11/2009 | Kumar | ................... | H05B 45/44 315/209 R |
| 2016/0064612 A1* | 3/2016 | Ren | ................... | G02F 1/133524 349/62 |
| 2016/0084761 A1* | 3/2016 | Rothberg | ............. | G01N 21/648 506/4 |

(Continued)

*Primary Examiner* — Tung X Le
(74) *Attorney, Agent, or Firm* — WOMBLE BOND DICKINSON (US) LLP

(57) ABSTRACT

Embodiments of this application provide a light emitting device, an electronic apparatus, a control apparatus, and a light emitting control method, and relate to the field of display technologies, to resolve a problem of low light emitting efficiency of the light emitting device. The light emitting device includes: a first electrode layer, an electroluminescent layer, and a nano antenna layer that are disposed in sequence, where the first electrode layer is configured to enable the electroluminescent layer to generate photons, and the nano antenna layer is configured to generate, when the photons generated by the electroluminescent layer are emitted to a surface that is of the nano antenna layer and that is close to the electroluminescent layer, a surface plasmon on the surface.

20 Claims, 9 Drawing Sheets

(56)            References Cited

U.S. PATENT DOCUMENTS

| | | |
|---|---|---|
| 2017/0167977 A1* | 6/2017 | Rivera .................. G01N 21/64 |
| 2017/0324063 A1 | 11/2017 | Ohara et al. |
| 2020/0075881 A1 | 3/2020 | Quan |
| 2020/0096614 A1* | 3/2020 | Amaya-Benitez ...... G01S 17/10 |
| 2020/0295288 A1 | 9/2020 | Fusella et al. |
| 2021/0265584 A1* | 8/2021 | Fusella ................. H10K 59/38 |

* cited by examiner

LIGHT EMITTING DEVICE, ELECTRONIC APPARATUS, CONTROL APPARATUS, AND LIGHT EMITTING CONTROL METHOD

CROSS-REFERENCE TO RELATED APPLICATIONS

This application is a continuation of International Application No. PCT/CN2020/142492, filed on Dec. 31, 2020, the disclosure of which is hereby incorporated by reference in its entirety.

TECHNICAL FIELD

This application relates to the field of display technologies, and in particular, to a light emitting device, an electronic apparatus, a control apparatus, and a light emitting control method.

BACKGROUND

With rapid development of display technologies, a light emitting device currently may be applied to a display panel and used as a self-luminous display panel for display. In comparison with a liquid crystal display panel, the self-luminous display panel has been widely applied because the self-luminous display panel does not need a backlight source.

As shown in FIG. 1, an organic light-emitting diode (OLED) display panel is used as an example of a self-luminous display panel, including a substrate 10, a plurality of pixel drive circuits 20, a flat layer 30, a plurality of light emitting devices 40, and a pixel defining layer 50 that are disposed on the substrate 10. One pixel drive circuit 20 is electrically connected to one light emitting device 40 (a connection relationship between the pixel drive circuit 20 and the light emitting device 40 is not shown in FIG. 1), and is configured to drive the light emitting device 40 to emit light. The pixel defining layer 50 includes a plurality of opening areas, and one light emitting device 40 is disposed in one opening area. The self-luminous display panel further includes a packaging film 60 disposed on the light emitting device 40. The light emitting device 40 includes a first electrode layer 401 and a third electrode layer 406 that are disposed opposite to each other, and an electroluminescent layer 403 disposed between the first electrode layer 401 and the third electrode layer 406. When a voltage is applied to the first electrode layer 401 and the third electrode layer 406, under effect of an electric field generated between the first electrode layer 401 and the third electrode layer 406, photons generated by the electroluminescent layer 403 are emitted through spontaneous emission to emit light.

However, because only a small quantity of photons generated by the electroluminescent layer 403 are emitted through spontaneous emission, and a large quantity of photons are left in the electroluminescent layer 403 and are lost due to being converting into heat, light emitting efficiency of the light emitting device 40 is very low.

SUMMARY

Embodiments of this application provide a light emitting device, an electronic apparatus, a control apparatus, and a light emitting control method, to resolve a problem of low light emitting efficiency of the light emitting device.

To achieve the foregoing objectives, the following technical solutions are used in this application.

According to a first aspect, a light emitting device is provided. The light emitting device includes: a first electrode layer, an electroluminescent layer, and a nano antenna layer that are disposed in sequence, where the first electrode layer is configured to enable the electroluminescent layer to generate photons, and the nano antenna layer is configured to generate, when the photons generated by the electroluminescent layer are emitted to a surface that is of the nano antenna layer and that is close to the electroluminescent layer, a surface plasmon on the surface. In comparison with a conventional technology in which photons generated by the electroluminescent layer can be emitted only through spontaneous emission at a probability, a large quantity of photons are left in the electroluminescent layer and lost due to being converted into heat. Therefore, light emitting efficiency of the electroluminescent layer is low. However, in an embodiment of the application, a nano antenna layer is disposed on one side of the electroluminescent layer. The nano antenna layer is configured to: when photons generated by the electroluminescent layer are emitted to the surface that is of the nano antenna layer and that is close to the electroluminescent layer, generate a surface plasmon on the surface that is of the nano antenna layer and that is close to the electroluminescent layer, and the surface plasmon is conducted along the nano antenna layer and radiates outward on a surface of the nano antenna layer. Therefore, photons that are in the electroluminescent layer and that are originally difficult to be radiated outward can be more easily radiated outward. In this way, light emitting efficiency of the light emitting device can be greatly improved.

In an embodiment, the nano antenna layer includes a plurality of nano antenna units that are arranged in sequence, two adjacent nano antenna units are in contact with each other, and the plurality of nano antenna units include a tunable nano antenna unit. The light emitting device further includes a second electrode layer disposed on a side that is of the tunable nano antenna unit and that is far away from the electroluminescent layer, where the tunable nano antenna unit is configured to convert between an insulation state and a metal state under effect of an electric field generated between the first electrode layer and the second electrode layer. Because the tunable nano antenna unit may convert between the metal state and the insulation state, a length of an effective part in the nano antenna layer may be adjusted by adjusting conversion of the tunable nano antenna unit between the metal state and the insulation state. A band range of the surface plasmon that radiates outward from the nano antenna layer is related to the length of the effective part in the nano antenna layer (that is, a part that can enable photons generated by the electroluminescent layer to radiate outward, or a part in the metal state in the nano antenna layer). Therefore, the band range of the surface plasmon that radiates outward from the nano antenna layer may be adjusted by adjusting the length of the effective part in the nano antenna layer. In this way, one light emitting device can emit light of a plurality of colors.

In an embodiment, the tunable nano antenna unit is configured to: convert to the metal state when electric field strength of the electric field generated between the first electrode layer and the second electrode layer is greater than an electric field threshold; or convert to the insulation state when electric field strength of the electric field generated between the first electrode layer and the second electrode layer is less than or equal to an electric field threshold. The tunable nano antenna unit may be converted between the metal state and the insulation state by adjusting the electric field strength of the electric field generated between the first electrode layer and the second electrode layer.

In an embodiment, that the first electrode layer is configured to enable the electroluminescent layer to generate photons includes: The first electrode layer generates an electric field with the nano antenna layer, to enable the electroluminescent layer to generate the photons under effect of the electric field. A voltage is applied to the first electrode layer and the nano antenna layer, so that the electroluminescent layer may generate the photons under the effect of the electric field generated between the first electrode layer and the nano antenna layer.

In an embodiment, the light emitting device further includes a third electrode layer disposed on a side that is of the electroluminescent layer and that is far away from the first electrode layer. That the first electrode layer is configured to enable the electroluminescent layer to generate photons includes: The first electrode layer generates an electric field with the third electrode layer, to enable the electroluminescent layer to generate the photons under effect of the electric field. A voltage is applied to the first electrode layer and the third electrode layer, so that the electroluminescent layer may generate the photons under the effect of the electric field generated between the first electrode layer and the third electrode layer.

In an embodiment, the plurality of nano antenna units further include a non-tunable nano antenna unit; the tunable nano antenna unit is disposed on one side of the non-tunable nano antenna unit in a first direction, and the tunable nano antenna unit is disposed on the other side of the non-tunable nano antenna unit in a second direction; and the non-tunable nano antenna unit is in the metal state, and the first direction intersects with the second direction. In this case, when the non-tunable nano antenna unit disposed in the first direction is in the metal state, and the non-tunable nano antenna unit disposed in the second direction is in the insulation state, the light emitting device may emit polarized light whose polarization direction is parallel to the first direction. When the non-tunable nano antenna unit disposed in the second direction is in the metal state, and the non-tunable nano antenna unit disposed in the first direction is in the insulation state, the light emitting device may emit polarized light whose polarization direction is parallel to the second direction. When both the non-tunable nano antenna units disposed in the first direction and the second direction are in the metal state, light emitted by the light emitting device is in a non-polarized state.

In an embodiment, the first direction and the second direction are perpendicular to each other. In this way, the polarized light whose polarization direction is the first direction and the polarized light whose polarization direction is the second direction may be prevented from mutually affecting each other.

In an embodiment, the light emitting device further includes an insulation layer disposed between the tunable nano antenna unit and the second electrode layer. The insulation layer may physically isolate the second electrode layer from the tunable nano antenna unit, to prevent the second electrode layer from affecting radiation performance of the nano antenna layer, and further prevent an excessively high electric field from being generated between the second electrode layer and the first electrode layer.

In an embodiment, a material of the tunable nano antenna unit includes at least one of vanadium dioxide and a germanium antimony tellurium compound.

In an embodiment, the light emitting device further includes a third electrode layer disposed on a side that is of the electroluminescent layer and that is far away from the first electrode layer, and the third electrode layer and the non-tunable nano antenna unit are separately disposed on the electroluminescent layer. Because the light emitting device includes the third electrode layer, a voltage may be applied to the first electrode layer and the third electrode layer to enable the electroluminescent layer to emit light.

In an embodiment, the light emitting device further includes a third electrode layer disposed on a side that is of the non-tunable nano antenna unit and that is far away from the electroluminescent layer, and the third electrode layer is in contact with the non-tunable nano antenna unit. Because the light emitting device includes the third electrode layer, a voltage may be applied to the first electrode layer and the third electrode layer to enable the electroluminescent layer to emit light.

In an embodiment, a material of the third electrode layer is the same as a material of the non-tunable nano antenna unit. In this way, the third electrode layer and the non-tunable nano antenna unit may be manufactured at the same time, to simplify a manufacturing process of a light emitting device.

In an embodiment, the third electrode layer and the non-tunable nano antenna unit are separately disposed on the electroluminescent layer, and the third electrode layer is in contact with the non-tunable nano antenna unit. When the third electrode layer is in contact with the non-tunable nano antenna unit, in an image composition process of a conductive film, the conductive film between the third electrode layer and the non-tunable nano antenna unit does not need to be etched off. Therefore, the manufacturing process of the light emitting device can be further simplified.

In an embodiment, the third electrode layer is located on the one side of the non-tunable nano antenna unit in an arrangement direction perpendicular to the plurality of nano antenna units. In this way, the third electrode layer may be prevented from affecting a length of the effective part in the nano antenna layer. This does not further affect a band range of light radiated from the nano antenna layer.

According to a second aspect, an electronic apparatus is provided. The electronic apparatus includes a plurality of light emitting devices. The electronic apparatus has a same technical effect as that in the foregoing embodiments. Details are not described herein again.

In an embodiment, a plurality of first electrode layers in light emitting devices located in a same column are electrically connected, and a plurality of second electrode layers in light emitting devices located in a same row are electrically connected. In this way, a same column of first electrode layers may be powered on at the same time, and a same row of second electrode layers that are electrically connected may be powered on at the same time. Therefore, not only a manufacturing process of the electronic apparatus can be simplified, but also a control process of the first electrode layer and the second electrode layer can be simplified.

In an embodiment, the plurality of first electrode layers in light emitting devices located in a same column are electrically connected, and a plurality of third electrode layers in light emitting devices located in a same row are electrically connected. In this way, a same column of first electrode layers may be powered on at the same time, and a same row of third electrode layers may be powered on at the same time. Therefore, not only a manufacturing process of the electronic apparatus can be simplified, but also a control process of the first electrode layer and the third electrode layer can be simplified.

In an embodiment, a plurality of light emitting devices include a first light emitting device and a second light emitting device, and a wavelength range of a surface plasmon of a nano antenna layer in the first light emitting device is different from a wavelength range of a surface plasmon of a nano antenna layer in the second light emitting device. In this way, the first light emitting device and the second light emitting device can emit light of different colors, and the electronic apparatus can implement color display.

In an embodiment, a plurality of light emitting devices include a first light emitting device and a second light emitting device; a shape of the nano antenna layer is a strip; and a length of a nano antenna layer in the first light emitting device is different from a length of a nano antenna layer in the second light emitting device. In this way, the first light emitting device and the second light emitting device can emit light of different colors, and the electronic apparatus can implement color display.

In an embodiment, a plurality of light emitting devices include a first light emitting device and a second light emitting device; and a material of a nano antenna layer in the first light emitting device is different from a material of the nano antenna layer in the second light emitting device. In this way, the first light emitting device and the second light emitting device can emit light of different colors, and the electronic apparatus can implement color display.

In an embodiment, the electronic apparatus further includes a drive circuit, where the drive circuit is configured to apply a voltage to the first electrode layer in the light emitting device.

In an embodiment, the electronic apparatus further includes a first processor, where the first processor is configured to control the drive circuit to apply the voltage to the first electrode layer in the light emitting device.

According to a third aspect, a method for controlling the foregoing light emitting device is provided. The method for controlling the foregoing light emitting device includes: applying a voltage to a first electrode layer in the light emitting device.

In an embodiment, the foregoing control method further includes: applying a voltage to a second electrode layer, so that a tunable nano antenna unit located between the first electrode layer and the second electrode layer converts from an insulation state to a metal state under effect of an electric field generated between the first electrode layer and the second electrode layer. The tunable nano antenna unit may be controlled to convert between an insulation state and a metal state, so that a length of an effective part in the nano antenna layer may be adjusted, and a band range of light radiated from the nano antenna layer may be further adjusted.

In an embodiment, the foregoing method for controlling the foregoing light emitting device further includes: applying a voltage to a third electrode layer, so that an electroluminescent layer located between the first electrode layer and the third electrode layer generates photons under effect of an electric field generated between the first electrode layer and the third electrode layer. Light emitting of the electroluminescent layer may be controlled by controlling to apply a voltage to the first electrode layer and the third electrode layer.

According to a fourth aspect, a method for controlling the foregoing electronic apparatus is provided. The method for controlling the foregoing electronic apparatus includes: applying a voltage to a first electrode layer in the light emitting device.

In an embodiment, the electronic apparatus includes a plurality of pixels, and each pixel includes a light emitting device. The method for controlling the electronic apparatus further includes: applying a voltage to a first group of second electrode layers within a first predetermined time period of a display period, and applying a voltage to a second group of second electrode layers within a second predetermined time period of the display period, so that a tunable nano antenna unit located between the first electrode layer and the second electrode layer is converted from an insulation state to a metal state under effect of an electric field generated between the first electrode layer and the second electrode layer. A quantity of the first group of second electrode layers is different from a quantity of the second group of second electrode layers. A color of light emitted in the first predetermined time period may be adjusted by adjusting the quantity of the first group of second electrode layers, and a color of light emitted in the second predetermined time period may be adjusted by adjusting the quantity of the second group of second electrode layers. Intensity of the light emitted in the first predetermined time period is controlled by controlling duration of the first predetermined time period, and intensity of the light emitted in the second predetermined time period is controlled by controlling duration of the second predetermined time period. Color and intensity of light emitted by the light emitting device in the first predetermined time period and the second predetermined time period are controlled, so that a color of light emitted by the light emitting device in one display period can be controlled. In this way, the electronic apparatus can implement color display.

In an embodiment, the control method for the electronic apparatus further includes: applying a voltage to the second electrode layers of a plurality of light emitting devices in the pixel, so that the tunable nano antenna unit located between the first electrode layer and the second electrode layer is converted from an insulation state to a metal state under the effect of the electric field generated between the first electrode layer and the second electrode layer. Quantities of second electrode layers to which voltages are applied in the plurality of light emitting devices in the pixel are different. Because quantities of second electrode layers to which voltages are applied in the plurality of light emitting devices in the pixel are different, colors of light emitted by the plurality of light emitting devices in the pixel are different, so that the electronic apparatus can implement color display.

In an embodiment, the control method further includes: applying a voltage to a third electrode layer in the light emitting device, so that an electroluminescent layer located between the first electrode layer and the third electrode layer generates photons under effect of an electric field generated between the first electrode layer and the third electrode layer. Light emitting of the electroluminescent layer may be controlled by controlling to apply a voltage to the first electrode layer and the third electrode layer.

According to a fifth aspect, a control apparatus is provided. The control apparatus includes a second processor and a first memory. The first memory stores program code, and when the program code is executed by the second processor, the foregoing control method for a light emitting device is implemented, or the foregoing control method for an electronic apparatus is implemented. The control apparatus has a same technical effect as that in the foregoing embodiments. Details are not described herein again.

7

Figure 2:
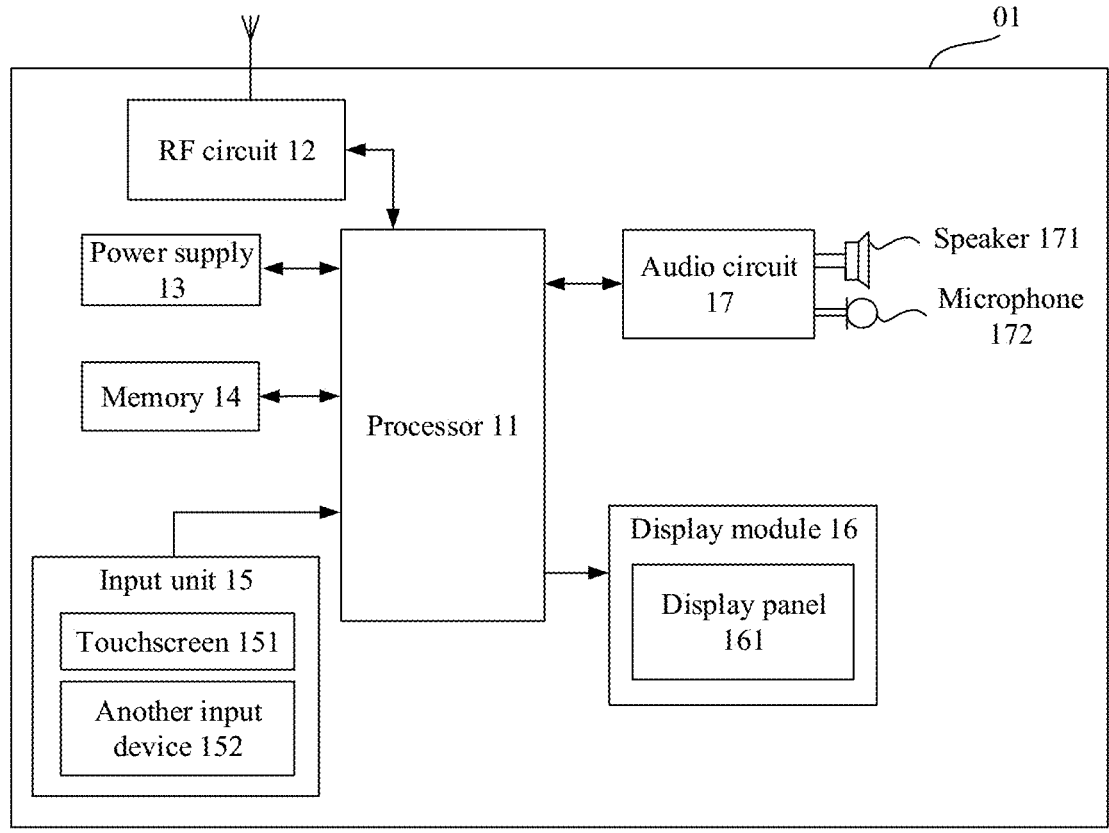
Figure 3:
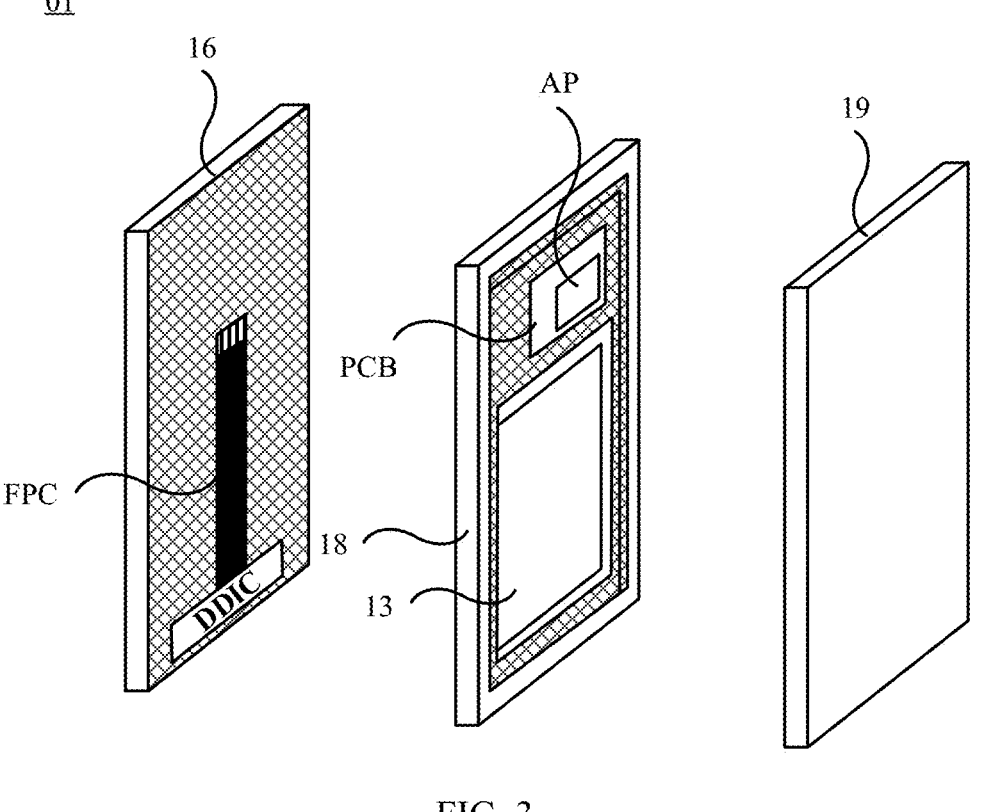
Figure 4:
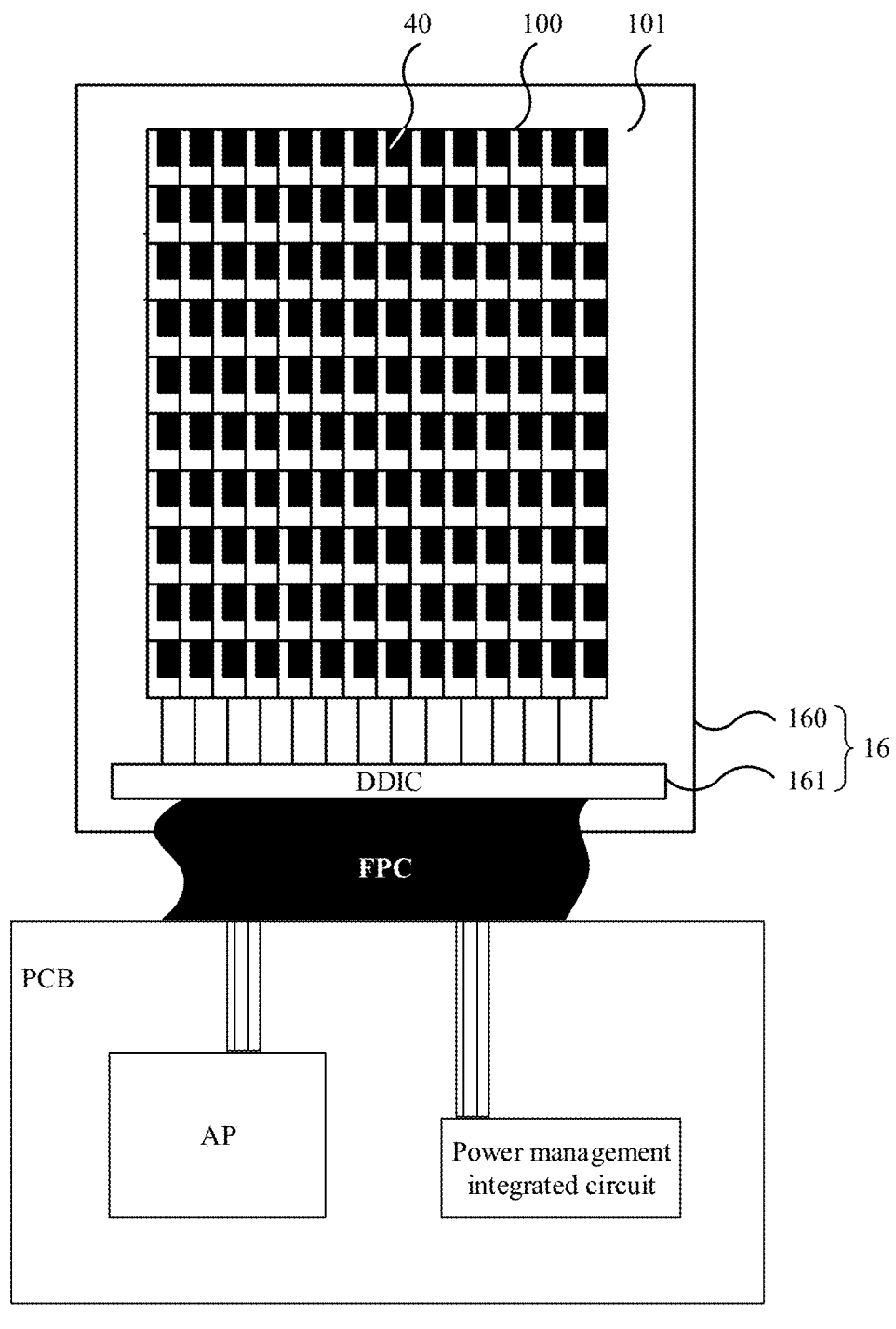
Figure 5:
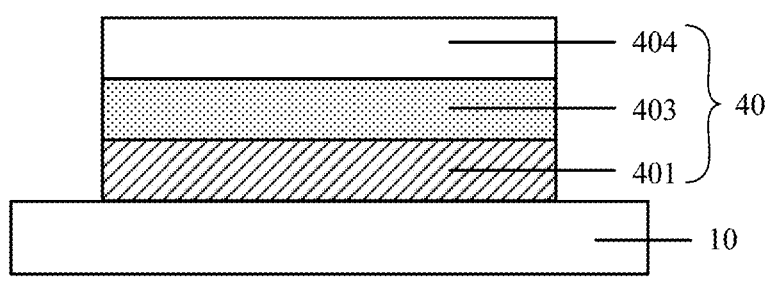
Figure 6A:
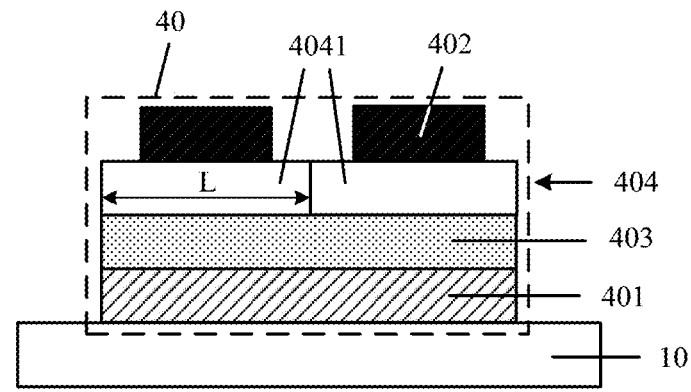
Figure 6B:
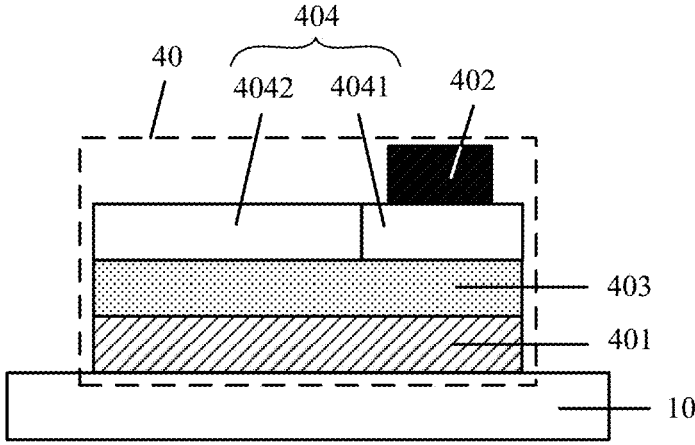
Figure 6C:
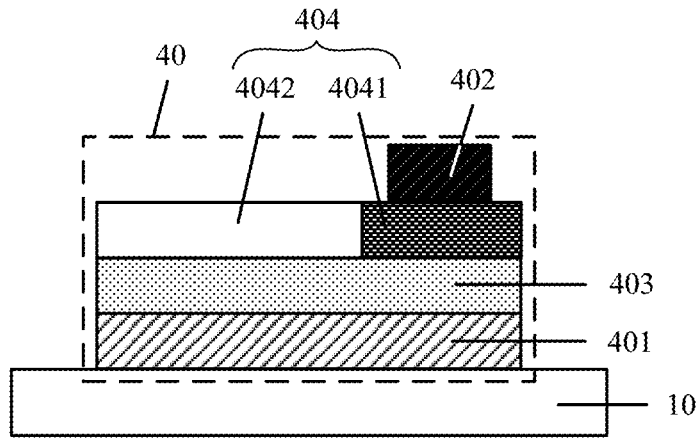
Figure 7A:
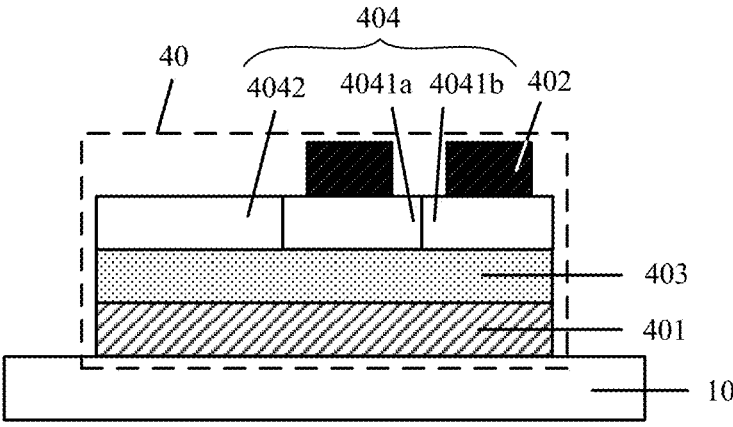
Figure 7B:
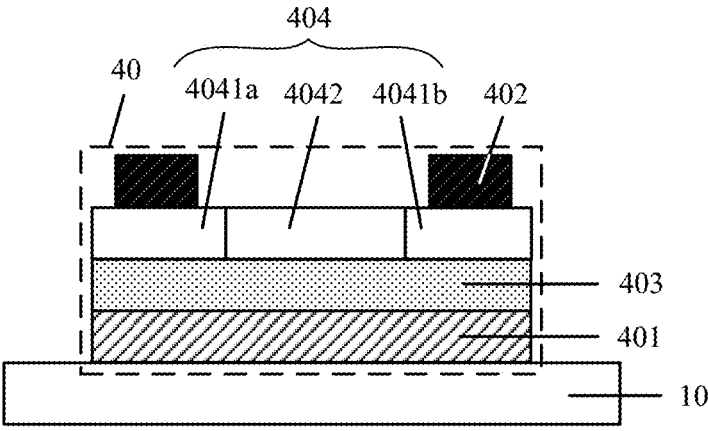
Figure 8:
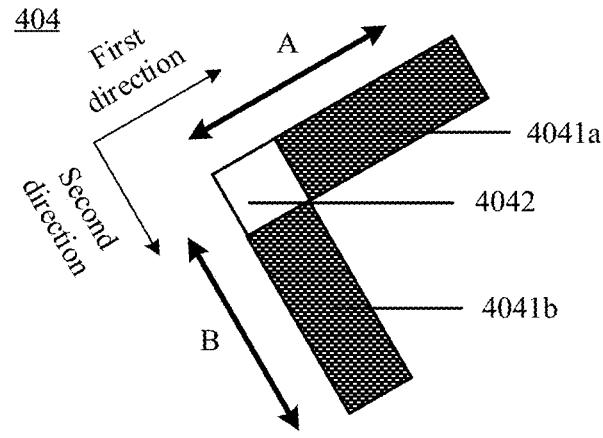
Figure 9:
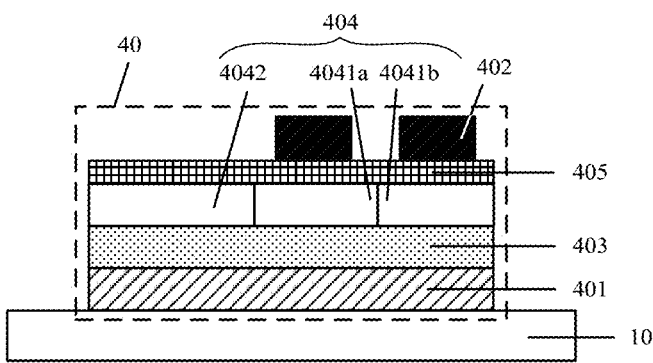
Figure 10A:
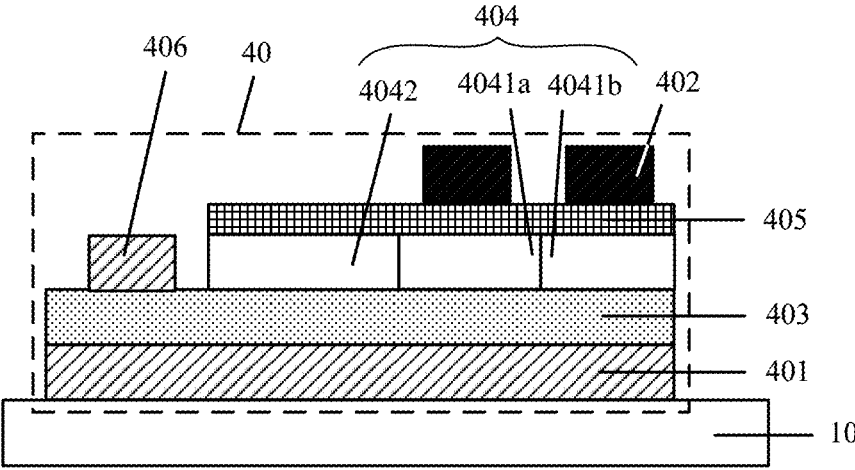
Figure 10B:
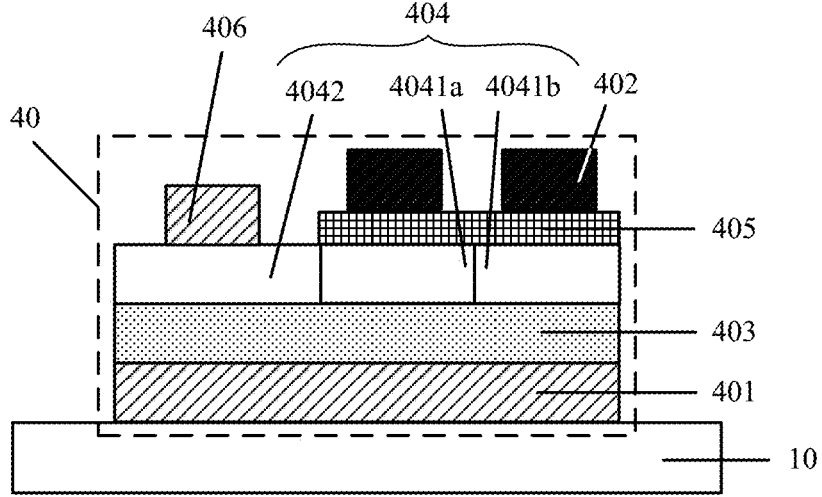
Figure 11:
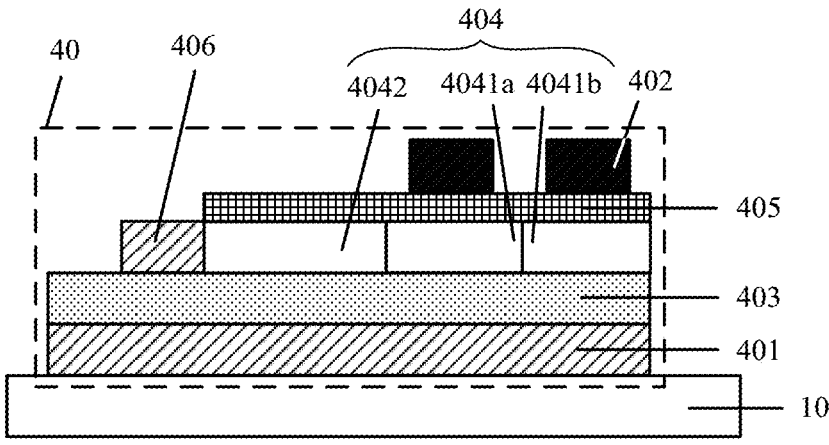
Figure 12A:
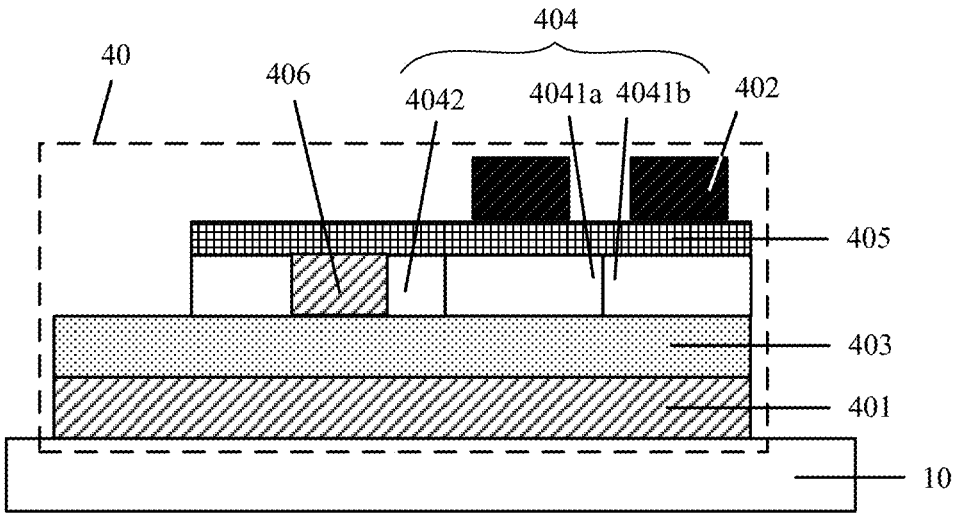
Figure 12B:
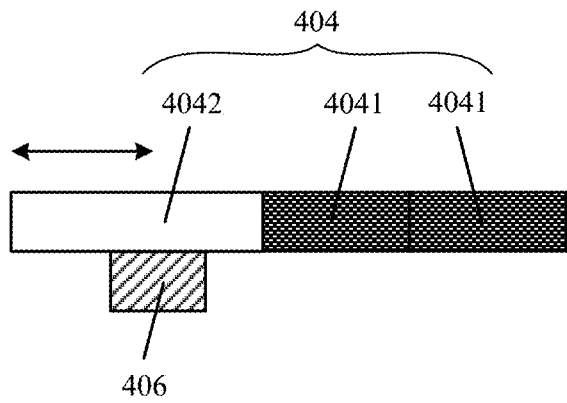
Figure 13:
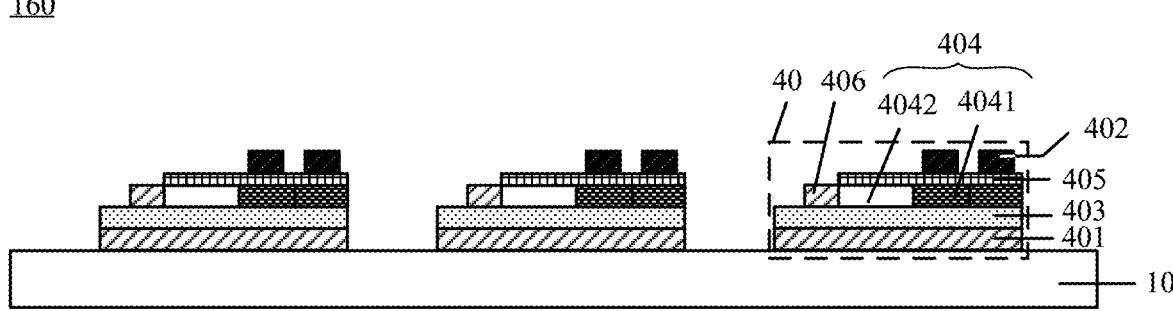
Figure 14:
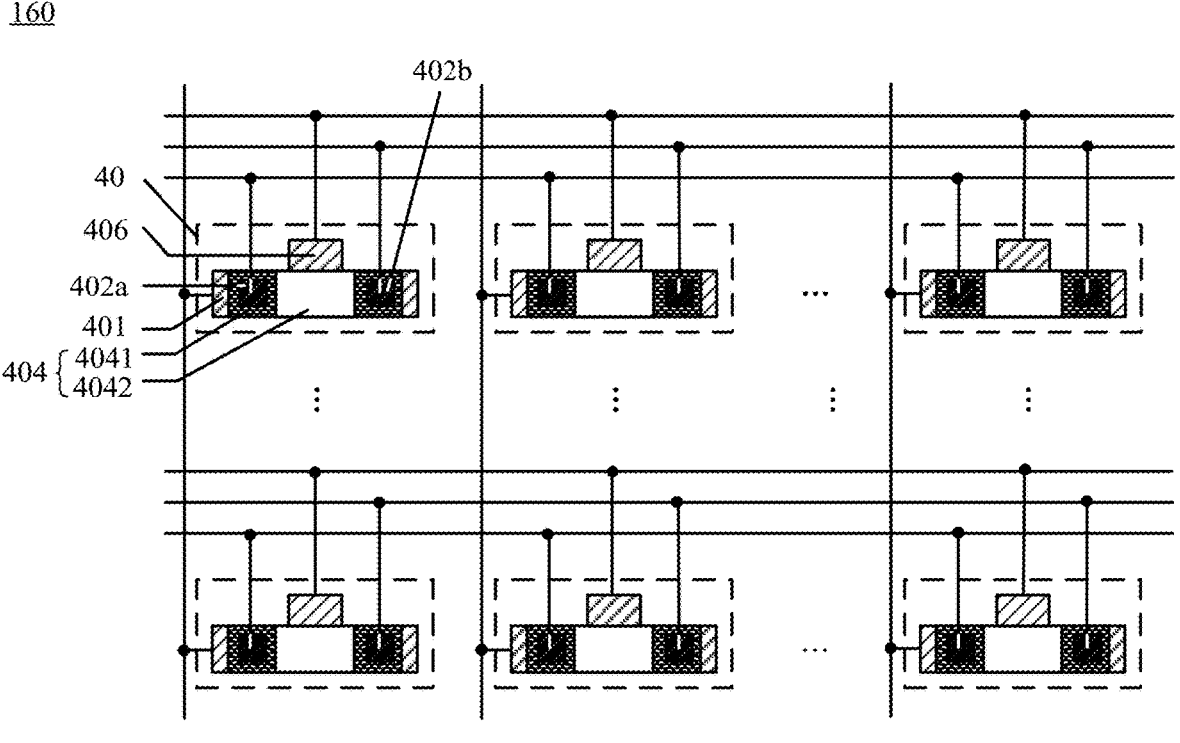

FIG. 2 is a schematic diagram of a hardware structure of an electronic device according to an embodiment of this application;

FIG. 3 is a schematic diagram of a structure of an electronic device according to an embodiment of this application;

FIG. 4 is a schematic diagram of a structure of a display module of an electronic device according to an embodiment of this application;

FIG. 5 is a schematic diagram of a structure of a light emitting device according to an embodiment of this application;

FIG. 6a is a schematic diagram of a structure of a light emitting device according to another embodiment of this application;

FIG. 6b is a schematic diagram of a structure of a light emitting device according to still another embodiment of this application;

FIG. 6c is a schematic diagram of a structure of a light emitting device according to yet another embodiment of this application;

FIG. 7a is a schematic diagram of a structure of a light emitting device according to another embodiment of this application;

FIG. 7b is a schematic diagram of a structure of a light emitting device according to still another embodiment of this application;

FIG. 8 is a schematic diagram of a structure of a nano antenna layer according to an embodiment of this application;

FIG. 9 is a schematic diagram of a structure of a light emitting device according to yet another embodiment of this application;

FIG. 10a is a schematic diagram of a structure of a light emitting device according to another embodiment of this application;

FIG. 10b is a schematic diagram of a structure of a light emitting device according to still another embodiment of this application;

FIG. 11 is a schematic diagram of a structure of a light emitting device according to yet another embodiment of this application;

FIG. 12a is a schematic diagram of a structure of a light emitting device according to another embodiment of this application;

FIG. 12b is a schematic diagram of a structure of a nano antenna layer and a third electrode layer according to an embodiment of this application;

FIG. 13 is a schematic diagram of a structure of a display panel according to an embodiment of this application; and FIG. 14 is a schematic diagram of a structure of a display panel according to another embodiment of this application.

REFERENCE NUMERALS

01: electronic device; 10: substrate; 11: first processor; 12: radio frequency circuit; 13: power supply; 14: second memory; 15: input unit; 16: display module; 17: audio circuit; 18: middle frame; 19: housing; 20: pixel drive circuit; 30: flat layer; 40: light emitting device; 50: pixel defining layer; 60: encapsulation film; 100: active area; 101: non-active area; 151: touchscreen; 152: another input device; 160: display panel; 161: drive circuit; 171: speaker; 172: microphone; 401: first electrode layer; 402: second electrode layer; 403: electroluminescent layer; 404: nano antenna layer; 405: insulation layer; 406: third electrode layer; 4041: tunable nano antenna unit; and 4042: non-tunable nano antenna unit.

DESCRIPTION OF EMBODIMENTS

The following describes the technical solutions in embodiments of this application with reference to the accompanying drawings in embodiments of this application. It is clearly that the described embodiments are merely some rather than all of embodiments of this application.

The following terms "first", "second" and the like are merely intended for ease of description, and shall not be understood as an indication or implication of relative importance or implicit indication of a quantity of indicated technical features. Therefore, a feature limited by "first", "second" and the like may explicitly indicate or implicitly include one or more such features. In description of this application, unless otherwise stated, "a plurality of" means two or more than two.

In addition, in embodiments of this application, "up", "down", "left", and "right" are not limited to definitions relative to directions in which components are schematically placed in the accompanying drawings. It should be understood that these directional terms may be relative concepts used for relative description and clarification, and may change correspondingly according to a change of a direction in which a component in the accompanying drawings is placed.

In this application, unless otherwise specified and limited, the term "connection" should be understood in a broad sense. For example, the "connection" may be a fixed connection, a detachable connection, an integration, a direct connection, or an indirect connection by using an intermediate medium. In addition, the term "electrical connection" may be a direct electrical connection, or may be an indirect electrical connection through an intermediate medium.

Embodiments of this application provide an electronic device including a display panel. The electronic device including a display panel may be a mobile phone, a tablet computer, a notebook computer, an ultra-mobile personal computer (UMPC), a netbook, a personal digital assistant (PDA), a wearable device (for example, a smartwatch), a virtual reality (VR) display device, an augmented reality (AR) display device, a vehicle-mounted mobile electronic device, or the like. A form of the electronic device is not limited in embodiments of this application.

FIG. 2 is an example of a schematic diagram of an architecture of an electronic device according to an embodiment of this application. As shown in FIG. 2, an electronic device 01 includes components such as a first processor 11, a radio frequency (RF) circuit 12, a power supply 13, a second memory 14, an input unit 15, a display module 16, and an audio circuit 17. One of ordinary skilled in the art may understand that a structure of the electronic device shown in FIG. 2 does not constitute a limitation on the electronic device 01. The electronic device 01 may include more or fewer components than those shown in FIG. 2, may combine some of the components shown in FIG. 2, or may have a different component arrangement from a component arrangement shown in FIG. 2.

The first processor 11 is a control center of the electronic device 01, is connected to all parts of the entire electronic device 01 by using various interfaces and lines, and performs various functions of the electronic device and data processing by running or executing a software program and/or a module stored in the second memory 14 and invoking data stored in the second memory 14, to perform overall monitoring on the electronic device. In an embodiment, the first processor 11 may include one or more processing units. For example, the first processor 11 may include an application processor (AP), a modem processor, a graphics processing unit (GPU), an image signal processor (ISP), an aerial controller, a video codec, a digital signal processor (DSP), a baseband processor, and/or a neural-network processing unit (NPU). Different processing units may be independent components, or may be integrated into one or more processors. Preferably, the application processor and the modem processor may be integrated into the first processor 11. The application processor mainly processes an operating system, a user interface, an application program, and the like. The modem processor mainly processes wireless communication. It may be understood that the modem processor may not be integrated into the first processor 11.

The RF circuit 12 is configured to receive/send a signal in an information receiving/sending process or a call process. Particularly, after the RF circuit 12 receives downlink information of a base station, the RF circuit 12 sends the downlink information to the first processor 11 for processing. In addition, the RF circuit 12 sends uplink data to the base station. Generally, the RF circuit 12 includes but is not limited to an antenna, at least one amplifier, a transceiver, a coupler, a low noise amplifier (LNA), a duplexer, and the like. In addition, the RF circuit 12 may further communicate with a network and another device through wireless communication. The wireless communication may use any communication standard or protocol, including but not limited to a global system for mobile communication (GSM), a general packet radio service (GPRS), code division multiple access (CDMA), wideband code division multiple access (WCDMA), long term evolution (LTE), an email, a short messaging service (SMS), and the like.

The power supply 13 (for example, a battery) is configured to supply power to each component in the electronic device 01. In an embodiment, the power supply 13 may be logically connected to the first processor 11 by using a power management system, to manage functions such as charging, discharging, and power consumption management by using the power management system.

The second memory 14 is configured to store a software program and a module. The first processor 11 executes various functional applications of the electronic device and processes data by running the software program and the module that are stored in the second memory 14. The second memory 14 mainly includes a program storage area and a data storage area. The program storage area may store an operating system, an application program required by at least one function (such as a sound play function or an image play function), and the like. The data storage area may store data (such as audio data, image data, and a phone book) created based on use of the mobile phone, and the like. In addition, the second memory 14 may include a high-speed random access memory, or may include a non-volatile memory, for example, at least one magnetic disk storage device, a flash memory device, or another volatile solid-state storage device.

The input unit 15 may be configured to: receive input digit or character information, and generate key signal input related to a user setting and function control of the electronic device. For example, the input unit 15 may include a touchscreen 151 and another input device 152. The touchscreen 151, also referred to as a touch panel, may collect a touch operation performed by a user on the touchscreen or near the touchscreen (for example, an operation performed by the user on the touchscreen 151 or near the touchscreen 151 by using any proper object or accessory such as a finger or a stylus pen), and drive a corresponding connection apparatus based on a preset program. In an embodiment, the touchscreen 151 may include two parts: a touch detection apparatus and a touch controller. The touch detection apparatus detects a touch position of the user, detects a signal brought by the touch operation, and transfers the signal to the touch controller. The touch controller receives touch information from the touch detection apparatus, converts the touch information into touch point coordinates, and then sends the touch point coordinates to the first processor 11. The touch controller can receive and execute a command sent by the first processor 11. In addition, the touchscreen 151 may be implemented in a plurality of types such as a resistive type, a capacitive type, an infrared type, and a surface acoustic wave type. The another input device 152 may include but is not limited to one or more of a physical keyboard, a function key (such as a volume control key or a power on/off key), a trackball, a mouse, a joystick, or the like.

The display module 16 is configured to display information input by the user or information provided for the user, and various menus of the electronic device. The display module 16 includes a display panel 160. In this application, the display panel 160 may be configured by using an OLED display panel. Further, the touchscreen 151 may cover the display panel 160. After the touchscreen 151 detects a touch operation on or near the touchscreen 151, the touchscreen 151 transmits the touch operation to the first processor 11 to determine a type of a touch event, and then the first processor 11 provides corresponding visual output on the display panel 160 based on the type of the touch event. In FIG. 2, the touchscreen 151 and the display panel 160 are used as two independent components to implement input and output functions of the electronic device. However, in some embodiments, the touchscreen 151 and the display panel 160 may be integrated to implement the input and output functions of the electronic device.

The audio circuit 17, a speaker 171, and a microphone 172 are configured to provide an audio interface between the user and the electronic device. The audio circuit 17 may transmit an electrical signal converted from received audio data to the speaker 171, and the speaker 171 converts the electrical signal into a sound signal for outputting. In addition, the microphone 172 converts a collected sound signal into an electrical signal, and the audio circuit 17 receives the electrical signal, converts the electrical signal into audio data, and then outputs the audio data to the RF circuit 12 to send the audio data to another electronic device, or outputs the audio data to the second memory 14 for further processing.

In an embodiment, the electronic device shown in FIG. 2 may further include various sensors, for example, a gyroscope sensor, a hygrometer sensor, an infrared sensor, and a magnetometer sensor. Details are not described herein. In an embodiment, the electronic device shown in FIG. 2 may further include a wireless fidelity (Wi-Fi) module, a Bluetooth module, and the like. Details are not described herein.

It may be understood that in an embodiment of the application, an electronic device (for example, the electronic device shown in FIG. 2) may perform some or all of the operations in an embodiment of the application, these operations or operations are merely examples, and other operations or variations of various operations may be further performed in an embodiment of the application In addition, the operations may be performed in different sequences presented in embodiments of this application, and not all the operations in embodiments of this application may need to be performed. Embodiments of this application may be implemented separately, or may be implemented in any combination. This is not limited in this application.

For ease of description, the following describes an example in which the electronic device 01 is a mobile phone is used. As shown in FIG. 3, the electronic device 01 may further include a middle frame 18 and a housing 19. The display module 16 and the housing 19 are respectively located on two sides of the middle frame 18, and the display module 16 and the middle frame 18 are disposed in the housing 19. The power supply 13 may be disposed on the middle frame 18.

As shown in FIG. 4, the display module 16 includes the display panel 160, and the display panel 160 includes an active area (AA) 100 and a non-active area 101 located around the AA area 100. The AA area 100 includes a plurality of sub pixels arranged in a matrix form. The AA area is also referred to as a sub pixel area, and each sub pixel includes one light emitting device 40.

As shown in FIG. 4, the display module 16 further includes a drive circuit 161 disposed in the non-active area 101 of the display panel 160. The drive circuit 161 may be, for example, a display driver integrated circuit (DDIC). In this case, light emitting devices 40 located in a same column of sub pixels are coupled to the DDIC by using a same signal line.

As shown in FIG. 3 and FIG. 4, the electronic device 01 further includes a printed circuit board (PCB) (or a drive system board), and an application processor (for example, a CPU) and a power management integrated circuit (power IC) that are installed on the PCB. As shown in FIG. 3, the printed circuit board may be disposed on the middle frame 18. The DDIC in FIG. 4 is coupled to the AP by using a flexible printed circuit (FPC).

In this way, the AP provides display data for the DDIC and the display panel 160, to display actual image information. The power IC provides a working voltage for the DDIC and the display panel 160. The FPC provides a signal transmission connection path between the PCB and the display module 16. The FPC is connected to the PCB by using a connector, and the FPC at the other end is bonded (bonding) to the display module 16 through a contradirectional conductive film. The DDIC is configured to: receive a signal transmitted by the PCB, and transmit the signal to the display panel 160 in a time sequence. For example, after display data output by the AP passes through the DDIC, the display data is converted into data voltage Vdata, and the data voltage Vdata is transmitted to the light emitting device 40 coupled to each signal line, to drive the light emitting device 40 to emit light.

An embodiment of this application provides an electronic apparatus. The electronic apparatus may be the display panel 160, the display module 16, or the electronic device 01.

An embodiment of this application further provides a light emitting device 40, and the light emitting device may be used in the display panel 160. As shown in FIG. 5, the light emitting device 40 includes: a first electrode layer 401, an electroluminescent layer 403, and a nano antenna layer 404 that are disposed in sequence. The first electrode layer 401 is configured to enable the electroluminescent layer 403 to generate photons. The nano antenna layer 404 is configured to: when the photons generated by the electroluminescent layer 403 are emitted to a surface that is of the nano antenna layer 404 and that is close to the electroluminescent layer 403, generate a surface plasmon (SP) on the surface.

It should be noted that the surface plasmon is an electromagnetic oscillation formed by interaction between free electrons and photons on a metal surface. When an optical wave (an electromagnetic wave) is incident on an interface between metal and dielectric, free electrons on the metal surface oscillate collectively. The electromagnetic wave is coupled with the free electrons on the metal surface to form a near-field electromagnetic wave that propagates along the metal surface. If an oscillation frequency of an electron is the same as a frequency of the incident optical wave, resonance occurs. In a resonant state, energy of the electromagnetic field is effectively converted into collective vibration energy of the free electrons on the metal surface. In this case, a special electromagnetic mode is formed: The electromagnetic field is limited to a small range of the metal surface and is enhanced. This phenomenon is referred to as a surface plasmon phenomenon.

It should be understood that the first electrode layer 401 may be in direct contact with the electroluminescent layer 403, or another film layer may be disposed between the first electrode layer 401 and the electroluminescent layer 403. The electroluminescent layer 403 may be in direct contact with the nano antenna layer 404, or another film layer may be disposed between the electroluminescent layer 403 and the nano antenna layer 404.

In some embodiments, as shown in FIG. 5, the light emitting device 40 may be disposed on a substrate 10.

In this case, when the electroluminescent layer 403 is an organic electroluminescent layer or a quantum dot electroluminescent layer, in some embodiments, the light emitting device 40 may further include one or more layers of an electron transporting layer (ETL), an electron injection layer (EIL), a hole transporting layer (HTL), and a hole injection layer (HIL), where the electron transporting layer, the electron injection layer, the hole transporting layer, the hole injection layer, and the like may be stacked with the electroluminescent layer 403. When the first electrode layer 401 is used as an anode, the hole injection layer and the hole transporting layer are located between the first electrode layer 401 and the electroluminescent layer 403, and the electron transporting layer and the electron injection layer are located between the electroluminescent layer 403 and the nano antenna layer 404. When the first electrode layer 401 is used as a cathode, the electron transporting layer and the electron injection layer are located between the first electrode layer 401 and the electroluminescent layer 403, and the hole injection layer and the hole transporting layer are located between the electroluminescent layer 403 and the nano antenna layer 404. When the electroluminescent layer 403 is an organic electroluminescent layer, the light emitting device 40 may also be referred to as an OLED. When the electroluminescent layer 403 is a quantum dot electroluminescent layer, the light emitting device 40 may also be referred to as a quantum dot light emitting diode (QLED).

When the electroluminescent layer 403 is an inorganic electroluminescent layer, in some embodiments, the light emitting device 40 may further include a P-type semiconductor layer and an N-type semiconductor layer that are located on two sides of the electroluminescent layer 403. When the electroluminescent layer 403 is an inorganic electroluminescent layer, the light emitting device 40 may also be referred to as a micro light emitting diode (micro-LED).

It should be understood that the first electrode layer 401 is configured to enable the electroluminescent layer 403 to generate photons. In some embodiments, the nano antenna layer 404 may be multiplexed as an electrode. That the first electrode layer 401 is configured to enable the electroluminescent layer 403 to generate photons includes: The first electrode layer 401 is configured to generate an electric field with the nano antenna layer 404, to enable the electroluminescent layer 403 to generate the photons under effect of the electric field. A voltage is applied to the first electrode layer 401 and the nano antenna layer 404, so that the electric field is generated between the first electrode layer 401 and the nano antenna layer 404. In some other embodiments, the light emitting device 40 further includes a third electrode layer disposed on a side that is of the electroluminescent layer 403 and that is far away from the first electrode layer 401. That the first electrode layer 401 is configured to enable the electroluminescent layer 403 to generate photons includes: The first electrode layer 401 is configured to generate an electric field with the third electrode layer, to enable the electroluminescent layer 403 to generate the photons under effect of the electric field. A voltage is applied to the first electrode layer 401 and the third electrode layer, so that the electric field may be generated between the first electrode layer 401 and the third electrode layer. Herein, a voltage may be applied to the first electrode layer 401, the nano antenna layer 404, and the third electrode layer in the light emitting device 40 by using the drive circuit 161.

This embodiment of the application provides the light emitting device 40, including the first electrode layer 401, the electroluminescent layer 403, and the nano antenna layer 404 that are disposed in sequence. The first electrode layer 401 is configured to enable the electroluminescent layer 403 to generate the photons. In comparison with a conventional technology in which the photons generated by the electroluminescent layer 403 can be emitted only through spontaneous emission at a probability, a large quantity of photons are left in the electroluminescent layer 403 and lost due to being converted into heat. Consequently, light emitting efficiency of the electroluminescent layer 403 is low. However, in an embodiment of the application, the nano antenna layer 404 is disposed on one side of the electroluminescent layer 403. The nano antenna layer 404 is configured to: when the photons generated by the electroluminescent layer 403 are emitted to the surface that is of the nano antenna layer 404 and that is close to the electroluminescent layer 403, generate the surface plasmon on the surface of the nano antenna layer 404 and that is close to the electroluminescent layer 403, and the surface plasmon is conducted along the nano antenna layer 404 and radiates outward on the surface of the nano antenna layer 404. Therefore, photons that are in the electroluminescent layer 403 and that are originally difficult to be radiated outward can be more easily radiated outward. In this way, the light emitting efficiency of the light emitting device 40 can be greatly improved.

It should be noted that the light emitting efficiency of the light emitting device 40 includes external quantum efficiency and internal quantum efficiency. The internal quantum efficiency refers to efficiency of electro-optical conversion. The external quantum efficiency refers to a product of efficiency of electro-optical conversion and efficiency of light radiation. It may be learned from the foregoing description that, in an embodiment of the application, the external quantum efficiency of the light emitting device 40 is improved.

In some embodiments, as shown in FIG. 6a and FIG. 6b, the nano antenna layer 404 includes a plurality of nano antenna units arranged in sequence, two adjacent nano antenna units are in contact with each other, and the plurality of nano antenna units include a tunable nano antenna unit 4041. The light emitting device 40 further includes a second electrode layer 402 disposed on a side that is of the tunable nano antenna unit 4041 and that is far away from the electroluminescent layer 403. An orthographic projection of the second electrode layer 402 on the substrate 10 and an orthographic projection of the tunable nano antenna unit 4041 on the substrate 10 have an overlapping area. The tunable nano antenna unit 4041 is configured to convert between an insulation state (which may also be referred to as a dielectric state) and a metal state under effect of an electric field generated between the first electrode layer 401 and the second electrode layer 402.

The plurality of nano antenna units may include one tunable nano antenna unit 4041, or may include two or more tunable nano antenna units 4041.

Herein, in some examples, as shown in FIG. 6a, all the nano antenna units included in the nano antenna layer 404 are tunable nano antenna units 4041. FIG. 6a is illustrated by using an example in which the nano antenna layer 404 includes two tunable nano antenna units 4041. In some other examples, as shown in FIG. 6b, the nano antenna layer 404 includes the tunable nano antenna unit 4041 and a non-tunable nano antenna unit 4042, where the non-tunable nano antenna unit 4042 is in the metal state. FIG. 6b is illustrated by using an example in which the nano antenna layer 404 includes one tunable nano antenna unit 4041 and one non-tunable nano antenna unit 4042. When the nano antenna layer 404 includes a plurality of tunable nano antenna units 4041, lengths L of the plurality of tunable nano antenna units 4041 may be the same or different.

It should be noted that the nano antenna layer 404 includes three dimension sizes, and a largest size of the three dimension sizes is considered as a length of the nano antenna layer 404. Similarly, a largest size of three dimension sizes of the tunable nano antenna unit 4041 is considered as a length L of the tunable nano antenna unit 4041, and a largest size of three dimension sizes of the non-tunable nano antenna unit 4042 is considered as a length of the non-tunable nano antenna unit 4042.

It should be understood that, when the photons generated by the electroluminescent layer 403 are emitted to the surface that is of the nano antenna layer 404 and that is close to the electroluminescent layer 403, only a part in the metal state in the nano antenna layer 404 can generate the surface plasmon, and the surface plasmon radiates outward along the part in the metal state in the nano antenna layer 404. Therefore, an effective part in the nano antenna layer 404, that is, a part that enables the photons generated by the electroluminescent layer 403 to radiate outward, is the part in the metal state in the nano antenna layer 404. Based on this, a length of the effective part in the nano antenna layer 404 may be controlled by adjusting the tunable nano antenna unit 4041 to be in the metal state or the insulation state.

In some embodiments, the tunable nano antenna unit 4041 is configured to: convert to the metal state when electric field strength of the electric field generated between the first electrode layer 401 and the second electrode layer 402 is greater than an electric field threshold; or convert to the insulation state when electric field strength of the electric field generated between the first electrode layer 401 and the second electrode layer 402 is less than or equal to an electric field threshold.

Herein, the electric field threshold may be set based on a material of the tunable nano antenna unit 4041. In some examples, the electric field threshold is 0. In this case, the tunable nano antenna unit 4041 is configured to: convert to the metal state when a voltage is applied to the first electrode layer 401 and the second electrode layer 402, and convert to the insulation state when no voltage is applied to the first electrode layer 401 and the second electrode layer 402. In other words, when the first electrode layer 401 and the second electrode layer 402 are powered on, the tunable nano antenna unit 4041 is in the metal state, and when the first electrode layer 401 and the second electrode layer 402 are powered off, the tunable nano antenna unit 4041 is in the insulation state.

For example, the light emitting device 40 is of a structure shown in FIG. 6*b* and FIG. 6*c*. As shown in FIG. 6*b*, when a voltage is applied to the first electrode layer 401 and the second electrode layer 402, and the electric field strength of the electric field generated between the first electrode layer 401 and the second electrode layer 402 is greater than the electric field threshold, under the effect of the electric field generated between the first electrode layer 401 and the second electrode layer 402, the tunable nano antenna unit 4041 is converted into the metal state, and the tunable nano antenna unit 4041 is connected to the non-tunable nano antenna unit 4042 (the non-tunable nano antenna unit 4042 is in the metal state) on the left of the tunable nano antenna unit 4041. In this case, a length of the effective part in the nano antenna layer 404 is a sum of a length of the non-tunable nano antenna unit 4042 and a length of the tunable nano antenna unit 4041. As shown in FIG. 6*c*, when the electric field strength of the electric field generated between the first electrode layer 401 and the second electrode layer 402 is less than or equal to the electric field threshold, for example, when no voltage is applied, in other words, the first electrode layer 401 and the second electrode layer 402 are powered off, the tunable nano antenna unit 4041 is converted to the insulation state. In this case, a length of the effective part in the nano antenna layer 404 is a length of the non-tunable nano antenna unit 4042. It may be learned from the foregoing description that, the tunable nano antenna unit 4041 may be controlled to convert between the insulation state and the metal state by controlling the electric field strength of the electric field generated between the first electrode layer 401 and the second electrode layer 402. Therefore, a length of the effective part in the nano antenna layer 404 can be further controlled, that is, a length of the part that is of the nano antenna layer 404 and that enables the photons generated by the electroluminescent layer 403 to radiate outward can be controlled.

A material of the tunable nano antenna unit 4041 is a phase change material. The phase change material is a material that can be converted between a metal state and an insulation state, and a material state change is triggered through a temperature change, electric field excitation, light excitation, or the like. The phase change material in an embodiment of the application may be converted from an insulation state to a metal state under excitation by the electric field generated between the first electrode layer 401 and the second electrode layer 402. Because the tunable nano antenna unit 4041 is of a nano size, a material state conversion speed of the tunable nano antenna unit 4041 may be quite fast, to meet a response rate requirement of an electronic product.

For example, the material of the tunable nano antenna unit 4041 includes at least one of vanadium dioxide ($VO_2$) and a germanium antimony tellurium (GeSbTe) compound.

For example, a material of the non-tunable nano antenna unit 4042 includes metal or another conductive material. The metal may be, for example, silver (Ag), aluminum (Al), copper (Cu), platinum (Pt), or one or more of their alloys.

It should be noted that, photons radiated by the nano antenna layer 404 through enhancement depend on a resonant band of the nano antenna layer 404, and only optical radiation of the resonant band is enhanced, and optical radiation of a remaining part is very weak. Therefore, the resonant band of the nano antenna layer 404 may be designed, so that light of a band can be radiated outward from the nano antenna layer 404, that is, light of a color is emitted from the nano antenna layer 404. The resonant band of the nano antenna layer 404 is related to a length of a part that is in the nano antenna layer 404 and that can enable the photons generated by the electroluminescent layer 403 to radiate outward. Therefore, there is a proportional relationship between the length of the part that is in the nano antenna layer 404 and that can enable the photons generated by the electroluminescent layer 403 to radiate outward and a light wave band on which the part acts. In other words, a band range of the surface plasmon radiated from the surface of the nano antenna layer 404 is related to the length of the part that is in the nano antenna layer 404 and that can enable the photons generated by the electroluminescent layer 403 to radiate outward. If the length of the part that is in the nano antenna layer 404 and that can enable the photons generated by the electroluminescent layer 403 to radiate outward is changed, the band range of the surface plasmon radiated outward from the nano antenna layer 404 is also changed accordingly. The nano antenna layer 404 in an embodiment of the application is similar to an antenna in wireless communication, but a difference lies in that the nano antenna layer 404 in an embodiment of the application has a surface plasmon effect in a light wave band corresponding to an effective length of the nano antenna layer 404. In addition, for light of a same color, a wavelength of a surface plasmon is generally only ⅙ to ½ of a wavelength in the air. Therefore, only a short nano antenna layer 404 is required to resonate with light of a wavelength. For example, if blue light with a band of about 400 nm needs to be radiated outward from the nano antenna layer 404, a length of the effective part in the nano antenna layer 404 may be 100 nm or less than 100 nm. When the light emitting device 40 is used in a display panel, because a band of visible light during display is in a range of 380 nm to 750 nm, if visible light whose band is in the range of 380 nm to 750 nm needs to be radiated outward from the nano antenna layer 404, a length of the effective part in the nano antenna layer 404 is generally within a range of 20 nm to 200 nm. It may be understood that, when a material of the nano antenna layer 404 changes, a length range of the effective part in the nano antenna layer 404 may also change.

Based on the foregoing description, if a spectral width of light emitted by the electroluminescent layer 403 is wide, light of a corresponding band (light of a corresponding color) may be emitted by adjusting a length of the effective part in the nano antenna layer 404.

When the nano antenna layer 404 in the light emitting device 40 includes a plurality of tunable nano antenna units 4041, the light emitting device 40 may emit light of a plurality of colors by using a design.

For example, as shown in FIG. 7*a*, the nano antenna layer 404 includes three nano antenna units arranged in sequence, one nano antenna unit is the non-tunable nano antenna unit 4042, and the other two nano antenna units are tunable nano antenna units 4041*a* and 4041*b*. The two tunable nano antenna units 4041*a* and 4041*b* are located on a same side of the non-tunable nano antenna unit 4042. The non-tunable nano antenna unit 4042 determines a shortest wavelength of light emitted by the light emitting device 40, for example, 400 nm. When a first tunable nano antenna unit 4041*a* on the left is converted to a metal state under effect of an electric field, a length of the effective part in the nano antenna layer 404 is a sum of a length of the non-tunable nano antenna unit 4042 and a length of the first tunable nano antenna unit 4041a. In this case, a wavelength of the light emitted by the light emitting device 40 is 500 nm. When the two tunable nano antenna units 4041a and 4041b are both converted to a metal state under effect of an electric field, a length of the effective part in the nano antenna layer 404 is a sum of a length of the non-tunable nano antenna unit 4042 and lengths of the two tunable nano antenna units 4041a and 4041b. In this case, a wavelength of the light emitted by the light emitting device 40 is 600 nm.

For another example, as shown in FIG. 7b, the nano antenna layer 404 includes three nano antenna units arranged in sequence, one nano antenna unit is the non-tunable nano antenna unit 4042, and the other two nano antenna units are tunable nano antenna units 4041a and 4041b. The other two tunable nano antenna units 4041a and 4041b are respectively located on two sides of the non-tunable nano antenna unit 4042. When no electric field is applied to the left tunable nano antenna unit 4041a and the right tunable nano antenna unit 4041b, a length of the effective part in the nano antenna layer 404 is a length of the non-tunable nano antenna unit 4042. In this case, a wavelength of the light emitted by the light emitting device 40 is 400 nm. When only the left tunable nano antenna unit 4041a is converted to a metal state under effect of an electric field, a length of the effective part in the nano antenna layer 404 is a sum of a length of the non-tunable nano antenna unit 4042 and a length of the left tunable nano antenna unit 4041a. In this case, a wavelength of light emitted by the light emitting device 40 is 500 nm. When only the right tunable nano antenna unit 4041b is converted to a metal state under effect of an electric field, a length of the effective part in the nano antenna layer 404 is a sum of a length of the non-tunable nano antenna unit 4042 and a length of the right tunable nano antenna unit 4041b. In this case, a wavelength of light emitted by the light emitting device 40 is 600 nm. When both the left tunable nano antenna unit 4041a and the right tunable nano antenna unit 4041b are converted to a metal state under effect of an electric field, a length of the effective part in the nano antenna layer 404 is a sum of a length of the non-tunable nano antenna unit 4042, a length of the left tunable nano antenna unit 4041a, and a length of the right tunable nano antenna unit 4041b. In this case, a wavelength of light emitted by the light emitting device 40 is 700 nm. Based on this, it may be seen that the light emitting device 40 may emit light of four colors.

Based on the foregoing description, the nano antenna layer 404 may further include more tunable nano antenna units 4041, to support the light emitting device 40 in emitting light of more colors.

In an embodiment of the application, the nano antenna layer 404 includes a plurality of nano antenna units that are arranged in sequence, and the plurality of nano antenna units include the tunable nano antenna unit 4041. The tunable nano antenna unit 4041 is configured to convert between an insulation state and a metal state under the effect of the electric field generated between the first electrode layer 401 and the second electrode layer 402. Because the tunable nano antenna unit 4041 may convert between a metal state and an insulation state, a length of the effective part in the nano antenna layer 404 may be adjusted by converting the tunable nano antenna unit 4041 between a metal state and an insulation state. However, a band range of the surface plasmon radiated outward from the surface of the nano antenna layer 404 is related to a length of the effective part in the nano antenna layer 404. Therefore, the band range of the surface plasmon radiated outward from the surface of the nano antenna layer 404 may be adjusted by adjusting the length of the effective part in the nano antenna layer 404. In this way, one light emitting device 40 can emit light of a plurality of colors.

In some embodiments, as shown in FIG. 8, the plurality of nano antenna units further include a non-tunable nano antenna unit 4042. The tunable nano antenna unit 4041 is disposed on one side of the non-tunable nano antenna unit 4042 in a first direction, and the tunable nano antenna unit 4041 is disposed on the other side of the non-tunable nano antenna unit 4042 in a second direction, and the non-tunable nano antenna unit 4042 is in a metal state. The first direction intersects with the second direction, that is, the first direction is not parallel to the second direction.

In this case, there may be one or more tunable nano antenna units 4041 disposed on one side of the non-tunable nano antenna unit 4042 in the first direction and tunable nano antenna units 4041 disposed on the other side of the non-tunable nano antenna unit 4042 in the second direction.

It should be noted that, when the effective part of the nano antenna layer 404 has different sizes in three dimensions, and a size in one dimension is large, a largest size of the effective part in the nano antenna layer 404 in the three-dimensional size is considered as a length of the effective part in the nano antenna layer 404. A length direction of the effective part in the nano antenna layer 404 is referred to as a polarization direction of the nano antenna layer 404. For the nano antenna layer 404 having the polarization direction, the nano antenna layer 404 has polarized light selectivity. Because the effective part in the nano antenna layer 404 has a strong enhancement effect on radiation of light whose polarization direction is the same as the polarization direction of the nano antenna layer 404, the light radiated from the nano antenna layer 404 is polarized light, and a polarization direction of the polarized light is the same as the polarization direction of the nano antenna layer 404, that is, radiation of the polarized light may be implemented by using the nano antenna layer 404.

It should be understood that, in addition to a color (namely, a wavelength), an attribute of light has a polarization characteristic. Refer to FIG. 8. When the tunable nano antenna unit 4041a disposed on one side of the non-tunable nano antenna unit 4042 in the first direction is converted to a metal state under effect of an electric field, and when the tunable nano antenna unit 4041b disposed on one side of the non-tunable nano antenna unit 4042 in the second direction is in an insulation state, a polarization direction of the effective part in the nano antenna layer 404 is parallel to the first direction, that is, the lower left direction and the upper right direction shown by the double arrow A in FIG. 8, and light emitted by the electroluminescent layer 403 is emitted from the non-tunable nano antenna unit 4042 and the tunable nano antenna unit 4041a. In this case, emitted polarized light oscillates in a direction parallel to the first direction (that is, the lower left direction and the upper right direction shown by the double arrow A in FIG. 8). In other words, a polarization direction of the emitted light is parallel to the first direction. In this case, a wavelength of the emitted polarized light is related to a length of the non-tunable nano antenna unit 4042 in the first direction and a length of the tunable nano antenna unit 4041a in a metal state.

When the tunable nano antenna unit 4041b disposed on the other side of the non-tunable nano antenna unit 4042 in the second direction is converted to a metal state under effect of an electric field, and when the tunable nano antenna unit 4041*a* disposed on one side of the non-tunable nano antenna unit 4042 in the first direction is in an insulation state, a polarization direction of the effective part in the nano antenna layer 404 is parallel to the second direction, that is, the upper left direction and the lower right direction shown by the double arrow B in FIG. 8, and light emitted by the electroluminescent layer 403 is emitted from the non-tunable nano antenna unit 4042 and the tunable nano antenna unit 4041*b*. In this case, emitted polarized light oscillates in a direction parallel to the second direction (that is, the upper left direction and the lower right direction shown by the double arrow B in FIG. 8). In other words, a polarization direction of the emitted light is parallel to the second direction. In this case, a wavelength of the emitted polarized light is related to a length of the non-tunable nano antenna unit 4042 in the second direction and a length of the tunable nano antenna unit 4041*a* in a metal state. Based on this, a polarization direction of light radiated from the nano antenna layer 404 may be selected.

In an embodiment of the application, the plurality of nano antenna units include the non-tunable nano antenna unit 4042. The tunable nano antenna unit 4041 is disposed on one side of the non-tunable nano antenna unit 4042 in the first direction, and the tunable nano antenna unit 4041 is disposed on the other side of the non-tunable nano antenna unit 4042 in the second direction, and the first direction intersects with the second direction. Therefore, when the non-tunable nano antenna unit 4042 disposed in the first direction is in a metal state, and the non-tunable nano antenna unit 4042 disposed in the second direction is in an insulation state, the light emitting device 40 may emit polarized light whose polarization direction is parallel to the first direction; when the non-tunable nano antenna unit 4042 disposed in the second direction is in a metal state, and the non-tunable nano antenna unit 4042 disposed in the first direction is in an insulation state, the light emitting device 40 may emit polarized light whose polarization direction is parallel to the second direction; and when both the non-tunable nano antenna units 4042 disposed in the first direction and the second direction are in a metal state, the light emitted by the light emitting device 40 is in a non-polarized state.

Based on the foregoing description, the light emitting device 40 may emit, in a time-division manner, polarized light whose polarization direction is parallel to the first direction and polarized light whose polarization direction is parallel to the second direction. Therefore, the light emitting device 40 may be applied to the display panel 160, to implement 3D (3 dimensions, three-dimensional) display. For example, the polarized light whose polarization direction is parallel to the first direction may be emitted to the left eye of a viewer, and the polarized light whose polarization direction is parallel to the second direction may be emitted to the right eye of a viewer by wearing glasses with polarization selectivity or by disposing a component that can adjust a light-emitting direction, to implement 3D display. Alternatively, the light emitting device 40 is applied to the display panel 160, so that the display panel 160 can display two different images. For example, the polarized light whose polarization direction is the first direction is used to form a first image, the polarized light whose polarization direction is the second direction is used to form a second image, and a component that can adjust a light-emitting direction is disposed, so that the polarized light whose polarization direction is the first direction is emitted to the left, and the polarized light whose polarization direction is the second direction is emitted to the right. In this way, a viewer on the left can view the first image, and a viewer on the right can view the second image. When the light emitting device 40 may emit polarized light in two polarization directions in a time-division manner, the light emitting device 40 may be applied to, but is not limited to, the foregoing two cases.

To prevent the polarized light whose polarization direction is the first direction and the polarized light whose polarization direction is the second direction from mutually affecting each other, in some embodiments, the first direction and the second direction are perpendicular to each other.

Because the first direction and the second direction are perpendicular to each other, two types of polarized light whose polarization directions are orthogonal to each other may be emitted from the nano antenna layer 404. Generally, light in various polarization directions may be constructed by using two pieces of mutually orthogonal polarized light. For example, a light emitting period T may be determined within a time limited by the persistence of vision time, and the light emitting period T is divided into two parts: light emitting time T1 and T2. Within the light emitting time T1, an electric field is applied, to enable the tunable nano antenna unit 4041 disposed on one side of the non-tunable nano antenna unit 4042 in the first direction to be in a metal state, and enable the tunable nano antenna unit 4041 disposed on the other side of the non-tunable nano antenna unit 4042 in the second direction to be in an insulation state. In this case, only polarized light whose polarization direction is parallel to the first direction is emitted. Within the light emitting time T2, an electric field is applied, to enable the tunable nano antenna unit 4041 disposed on one side of the non-tunable nano antenna unit 4042 in the second direction to be in a metal state, and enable all the tunable nano antenna units 4041 disposed on the other side of the non-tunable nano antenna unit 4042 in the first direction to be in an insulation state. In this case, only polarized light whose polarization direction is parallel to the second direction is emitted. If T1 or T2 is 0, light that is emitted by the display panel 160 and that is seen by a viewer is polarized light, and a polarization direction is parallel to the first direction or the second direction. If T1=T2, light that is emitted by the display panel 160 and that is seen by a viewer is non-polarized light. If T1≠T2, and neither T1 nor T2 is zero, light that is emitted by the display panel 160 and that is seen by a viewer is polarized light, and a polarization direction is related to values of T1 and T2.

In some embodiments, as shown in FIG. 9, the light emitting device 40 further includes an insulation layer 405 disposed between the tunable nano antenna unit 4041 and the second electrode layer 402.

For example, a material of the insulation layer 405 may be at least one of silicon nitride (SiNx), silicon oxide (SiOx), or silicon oxynitride (SiOxNy).

In this case, the insulation layer 405 may also be disposed above the non-tunable nano antenna unit 4042.

The light emitting device 40 further includes the insulation layer 405 disposed between the tunable nano antenna unit 4041 and the second electrode layer 402. The insulation layer 405 may physically isolate the second electrode layer 402 from the tunable nano antenna unit 4041, to prevent the second electrode layer 402 from affecting radiation performance of the nano antenna layer 404, and further prevent an excessively high electric field from being generated between the second electrode layer 402 and the first electrode layer 401.

It should be noted that, when the light emitting device 40 is applied to the display panel, all the light emitting devices 40 are micro-structures. Therefore, even if a voltage difference between the first electrode layer 401 and the second electrode layer 402 is low, for example, about 0.5 V, because a distance between the first electrode layer 401 and the second electrode layer 402 is short, for example, 0.5 μm, the electric field generated between the first electrode layer 401 and the second electrode layer 402 is also intense, and may reach 106 V/m. Generally, such a high electric field does not exist in an application environment of the light emitting device 40. Therefore, occasional external electric field interference does not affect light emitting of the light emitting device 40.

In some embodiments, as shown in FIG. 10*a* and FIG. 10*b*, the light emitting device 40 further includes a third electrode layer 406 disposed on a side that is of the electroluminescent layer 403 and that is far away from the first electrode layer 401. In some examples, as shown in FIG. 10*a*, the third electrode layer 406 and the non-tunable nano antenna unit 4042 are respectively disposed on the electroluminescent layer 403. In some other examples, as shown in FIG. 10*b*, the third electrode layer 406 is located on a side that is of the non-tunable nano antenna unit 4042 and that is far away from the electroluminescent layer 403, and the third electrode layer 406 is in contact with the non-tunable nano antenna unit 4042.

It should be understood that, the third electrode layer 406 and the non-tunable nano antenna unit 4042 are respectively disposed on the electroluminescent layer 403, that is, there is no stacking relationship between the third electrode layer 406 and the non-tunable nano antenna unit 4042. For example, both the third electrode layer 406 and the non-tunable nano antenna unit 4042 may be in contact with the electroluminescent layer 403.

In this case, a voltage may be applied to the first electrode layer 401 and the third electrode layer 406 to enable the electroluminescent layer 403 to emit light, and a voltage may be applied to the first electrode layer 401 and the second electrode layer 402 to convert the tunable nano antenna unit 4041 from an insulation state to a metal state. In this case, a voltage may be applied to the first electrode layer 401, the second electrode layer 402, and the third electrode layer 406 in the light emitting device 40 by using the drive circuit 161.

In some embodiments, a material of the third electrode layer 406 is the same as a material of the non-tunable nano antenna unit 4042. In some other embodiments, materials of the third electrode layer 406 and the non-tunable nano antenna unit 4042 are different. When the third electrode layer 406 and the non-tunable nano antenna unit 4042 are made of a same material, the third electrode layer 406 and the non-tunable nano antenna unit 4042 may be manufactured at the same time, to simplify a manufacturing process of the light emitting device 40. A manufacturing process of the light emitting device 40 is: forming a layer of conductive film, performing image composition on the conductive film, and synchronously forming the third electrode layer 406 and the non-tunable nano antenna unit 4042.

When the third electrode layer 406 and the non-tunable nano antenna unit 4042 are respectively disposed on the electroluminescent layer 403, in some embodiments, as shown in FIG. 10*a*, the third electrode layer 406 and the non-tunable nano antenna unit 4042 are not in contact with each other. In some other embodiments, as shown in FIG. 11, the third electrode layer 406 is in contact with the non-tunable nano antenna unit 4042. Based on a process of synchronously manufacturing the third electrode layer 406 and the non-tunable nano antenna unit 4042, it may be learned that, when the third electrode layer 406 is in contact with the non-tunable nano antenna unit 4042, and the material of the third electrode layer 406 is the same as the material of the non-tunable nano antenna unit 4042, in a process of performing image composition on the conductive film, the conductive film between the third electrode layer 406 and the non-tunable nano antenna unit 4042 does not need to be etched off. Therefore, the manufacturing process of the light emitting device 40 can be further simplified.

When the third electrode layer 406 is in contact with the non-tunable nano antenna unit 4042, materials of the third electrode layer 406 and the non-tunable nano antenna unit 4042 are both conductive materials, the third electrode layer 406 is powered on, and the third electrode layer 406 is disposed in an arrangement direction of the plurality of nano antenna units in the nano antenna layer 404, as shown in FIG. 11. In this case, the third electrode layer 406 affects a length of the effective part in the nano antenna layer 404. In this way, a band of the light radiated from the nano antenna layer 404 changes. Based on this, in some embodiments, the third electrode layer 406 and the non-tunable nano antenna unit 4042 are respectively disposed on the electroluminescent layer 403. As shown in FIG. 12*a* and FIG. 12*b*, in an arrangement direction perpendicular to the plurality of nano antenna units, the third electrode layer 406 is located on one side of the non-tunable nano antenna unit 4042.

FIG. 12*b* is a top view, and a direction shown by double arrows in FIG. 12*b* is an arrangement direction of the plurality of nano antenna units in the nano antenna layer 404.

Because the third electrode layer 406 is located on one side of the non-tunable nano antenna unit 4042 in the arrangement direction perpendicular to the plurality of nano antenna units, impact of the third electrode layer 406 on a length of the effective part of the nano antenna layer 404 may be avoided.

An embodiment of this application further provides a control method for the light emitting device 40, and the method may be used to control the light emitting device 40 to emit light. The control method includes: applying a voltage to the first electrode layer 401 in the light emitting device 40.

It should be noted that the first electrode layer 401 is configured to enable the electroluminescent layer 403 to generate photons. To enable the electroluminescent layer 403 to emit light, in some embodiments, the nano antenna layer 404 in the light emitting device 40 may be multiplexed as an electrode. The foregoing control method further includes: applying a voltage to the nano antenna layer 404. A voltage is applied to the first electrode layer 401 and the nano antenna layer 404, so that the electroluminescent layer 403 may generate photons under effect of an electric field generated between the first electrode layer 401 and the nano antenna layer 404.

In some other embodiments, the light emitting device 40 further includes the third electrode layer 406, and the control method further includes: applying a voltage to the third electrode layer 406. A voltage is applied to the first electrode layer 401 and the third electrode layer 406, so that the electroluminescent layer 403 located between the first electrode layer 401 and the third electrode layer 406 may generate photons under effect of an electric field generated between the first electrode layer 401 and the third electrode layer 406.

In some embodiments, the light emitting device 40 includes the foregoing second electrode layer 402, and the foregoing control method further includes: applying a voltage to the second electrode layer 402, so that the tunable nano antenna unit 4041 located between the first electrode layer 401 and the second electrode layer 402 is converted from an insulation state to a metal state under effect of the electric field generated between the first electrode layer 401 and the second electrode layer 402.

Based on the foregoing description, the first processor 11 may control the drive circuit 161 to apply a voltage to the first electrode layer 401, the second electrode layer 402, and the third electrode layer 406 in the light emitting device 40.

Based on this, emitting intensity of the light emitting device 40 may be controlled by controlling the light emitting duration of the light emitting device 40.

When the light emitting device 40 is applied to the display panel 160, as shown in FIG. 13, the display panel 160 includes a plurality of light emitting devices 40. In some embodiments, the electroluminescent layer 403 in the light emitting device 40 is an organic electroluminescent layer. In this case, the display panel 160 is an OLED display panel. Alternatively, the electroluminescent layer 403 in the light emitting device 40 is a quantum electroluminescent layer. In this case, the display panel 160 is a QLED display panel. A plurality of light emitting devices 40 may be manufactured on the substrate 10 at the same time. To prevent light emitted by adjacent light emitting devices 40 from affecting each other, in some embodiments, the display panel 160 further includes a pixel defining layer 50 disposed on the substrate 10. The pixel defining layer 50 includes a plurality of opening areas, and one light emitting device 40 is located in one opening area.

In some other embodiments, the electroluminescent layer 403 in the light emitting device 40 is an inorganic electroluminescent layer. In this case, the display panel 160 is a micro-LED display panel. A plurality of light emitting devices 40 may be first formed on a donor substrate, and then the plurality of light emitting devices 40 are stripped from the donor substrate and transferred to the substrate 10 to form the display panel 160.

Because the display panel 160 includes the light emitting device 40, and the light emitting device 40 includes the nano antenna layer 404, when photons generated by the electroluminescent layer 403 are emitted to the surface that is of the nano antenna layer 404 and that is close to the electroluminescent layer 403, a surface plasmon is generated on the surface that is of the nano antenna layer 404 and that is close to the electroluminescent layer 403, and the surface plasmon is conducted along the nano antenna layer 404 and radiates outward on the surface of the nano antenna layer 404. Therefore, photons that are in the electroluminescent layer 403 and that are originally difficult to be radiated outward can be more easily radiated outward, to greatly improve light emitting efficiency of the light emitting device 40, and improve light emitting efficiency of the display panel 160.

Figure 1:
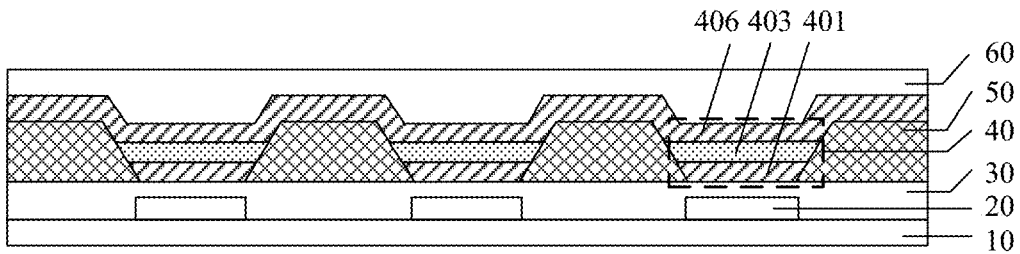
FIG. 1 is a schematic diagram of a structure of an OLED display panel according to a conventional technology.

It should be understood that the display panel 160 usually includes a large quantity of pixels, and one pixel includes, for example, three subpixels. Currently, sizes of pixels on the display panel 160 are set to be smaller. On one hand, a smaller size of the display panel 160 indicates a smaller size of a pixel on the display panel 160. For example, a pixel size of the display panel 160 on a mobile phone is less than a pixel size of the display panel 160 on a television, and a pixel size is smaller for a display panel of a VR display device or an AR display device. However, currently, a size of the display panel gradually decreases, and consequently, a size of a pixel gradually decreases. On the other hand, to increase contrast of the display panel 160, sizes of pixels on some large-sized display panels 160 are set to be smaller. However, a size of the pixel is reduced, which not only complicates a manufacturing process, but also results in a larger damage proportion of a side wall of the electroluminescent layer 403 in the light emitting device 40. For example, refer to FIG. 1. For an OLED display panel, when the electroluminescent layer 403 is manufactured, a side wall of the electroluminescent layer 403 in each light emitting device 40 is damaged. A smaller pixel size indicates a larger quantity of subpixels included in display panels with a same area, and a larger damage proportion of the side wall of the electroluminescent layer 403. Consequently, light emitting efficiency decreases rapidly as a quantity of pixels increases, and light emitting efficiency of the display panel 160 is excessively low.

In an embodiment of the application, light emitting efficiency of the display panel 160 may be improved by disposing the nano antenna layer 404 in the light emitting device 40. It may be learned from the foregoing description that, when the nano antenna layer 404 in the light emitting device 40 includes a plurality of nano antenna units that are arranged in sequence, and the plurality of nano antenna units include the tunable nano antenna unit 4041, the light emitting device 40 can emit light of a plurality of colors. Therefore, one light emitting device 40 in this application is equivalent to a plurality of subpixels in the conventional technology, that is, equivalent to one pixel in the conventional technology. In this way, a size of the pixel can be reduced without setting a size of the light emitting device 40 to be small. In comparison with the conventional technology, a manufacturing process of the display panel 160 is simplified. In addition, a size of the light emitting device 40 in an embodiment of the application may be set to be larger than a size of the light emitting device 40 in the conventional technology. In this way, a damage proportion of the side wall of the electroluminescent layer 403 can be reduced, and light emitting efficiency of the display panel 160 can also be improved.

When the light emitting device 40 is applied to the display panel 160, to ensure that the display panel 160 can implement color display, the following provides five implementations.

In a first implementation, the display panel 160 includes a plurality of pixels, each pixel includes one light emitting device 40, the nano antenna layer 404 in the light emitting device 40 includes a plurality of nano antenna units that are arranged in sequence, the plurality of nano antenna units include the tunable nano antenna unit 4041, and the light emitting device 40 further includes the second electrode layer 402 disposed on a side that is of the tunable nano antenna unit 4041 and that is far away from the electroluminescent layer 403.

It may be learned from the foregoing description that, when the nano antenna layer 404 in the light emitting device 40 includes a plurality of nano antenna units that are arranged in sequence, and the plurality of nano antenna units include the tunable nano antenna unit 4041, the light emitting device 40 can emit light of a plurality of colors.

A control method for the display panel 160 includes: applying a voltage to the first electrode layer 401 in the light emitting device 40; and applying a voltage to a first group of second electrode layers 402 within a first predetermined time period of a display period T, and applying a voltage to a second group of second electrode layers 402 within a second predetermined time period of the display period T, so that the tunable nano antenna unit 4041 located between the first electrode layer 401 and the second electrode layer 402 is converted from an insulation state to a metal state under effect of the electric field generated between the first electrode layer 401 and the second electrode layer 402. A quantity of the first group of second electrode layers 402 is different from a quantity of the second group of second electrode layers 402.

In this case, T should meet a limitation of persistence of vision effect of human eyes, for example, T=1 ms.

It should be noted that the quantity of the first group of second electrode layers 402 is different from the quantity of the second group of second electrode layers 402. Therefore, in the first predetermined time period, a length of the effective part in the nano antenna layer 404 is different from a length of the effective part in the nano antenna layer 404 in the second predetermined time period, so that a color of light emitted by the light emitting device 40 in the first predetermined time period is different from a color of light emitted by the light emitting device 40 in the second predetermined time period. Based on this, the color of the emitted light in the first predetermined time period may be adjusted by adjusting the quantity of the first group of second electrode layers 402, and the color of the emitted light in the second predetermined time period may be adjusted by adjusting the quantity of the second group of second electrode layers 402.

On this basis, because equivalent emitting intensity may be controlled by controlling light emitting duration of the light emitting element 40, intensity of the emitted light in the first predetermined time period may be controlled by controlling duration of the first predetermined time period, and intensity of the emitted light in the second predetermined time period may be controlled by controlling duration of the second predetermined time period.

Based on the foregoing description, the color and the intensity of the light emitted by the light emitting device 40 in the first predetermined time period and the second predetermined time period are controlled, so that the color of the light emitted by the light emitting device 40 in the display period T can be controlled, and the display panel 160 can implement color display.

In addition, it should be understood that the display period T may be divided into a plurality of predetermined time periods based on a requirement, including but not limited to the first predetermined time period and the second predetermined time period.

For example, during display, each light emitting device 40 may emit light of different colors by using a time division multiplexing method. It should be understood that the light emitting device 40 may emit light of a color in a display period T by mixing a plurality of primary colors. It is assumed that each light emitting device 40 includes n primary colors, and light emitting intensity of an $i^{th}$ primary color is Pi, where i=1, 2, . . . , and n. The equivalent light emitting intensity may be controlled by using light emitting duration. For example, one display period T is divided into n time segments, one color is displayed in each time segment, display duration of an $i^{th}$ color is Ti, and a relationship between display duration of n colors and light emitting intensity of n colors is T1: T2. Tn=P1: P2. Pn, and T1+T2+ . . . +Tn=T. Based on this, the light emitting device 40 may be controlled to emit light of a color in one display period T by controlling the light emitting device 40 to emit i primary colors and light emitting duration of the i primary colors. It should be understood that, when the light emitting device 40 emits light of an $i^{th}$ color, in addition to controlling the electroluminescent layer 403 to emit light, a length of the effective part in the nano antenna layer 404 needs to be controlled by controlling the second electrode layer 402 to be powered on or powered off, so that light corresponding to a primary color is emitted from the nano antenna layer 404.

In a second implementation, the display panel 160 includes a plurality of pixels, each pixel includes a plurality of light emitting devices 40, the nano antenna layer 404 in the light emitting devices 40 includes a plurality of nano antenna units that are arranged in sequence, the plurality of nano antenna units include the tunable nano antenna unit 4041, and the light emitting devices 40 further include the second electrode layer 402 disposed on a side that is of the tunable nano antenna unit 4041 and that is far away from the electroluminescent layer 403.

A control method for the display panel 160 further includes: applying a voltage to the first electrode layer 401 of the light emitting device 40; and applying a voltage to the second electrode layers 402 of the plurality of light emitting devices in the pixel, so that the tunable nano antenna unit 4041 located between the first electrode layer 401 and the second electrode layer 402 is converted from an insulation state to a metal state under effect of the electric field generated between the first electrode layer 401 and the second electrode layer 402. Quantities of second electrode layers 402 to which voltages are applied in the plurality of light emitting devices 40 in the pixel are different.

In this case, because a length of the effective part in the nano antenna layer 404 is related to a quantity of the second electrode layers 402 to which the voltage is applied in the light emitting device 40, and the length of the effective part in the nano antenna layer 404 determines a color of light emitted by the light emitting device 40, a quantity of second electrode layers 402 to which a voltage is applied in the light emitting device 40 determines a color of the light emitted by the light emitting device 40. Based on this, because quantities of second electrode layers 402 to which voltages are applied in plurality of light emitting devices 40 in the pixel are different, colors of light emitted by the plurality of light emitting devices 40 in the pixel are different, so that the display panel 160 can implement color display.

In a third implementation, the display panel 160 includes a plurality of pixels, and each pixel includes a first light emitting device and a second light emitting device; and a wavelength range of a surface plasmon on a surface of the nano antenna layer 404 in the first light emitting device is different from a wavelength range of a surface plasmon on a surface of the nano antenna layer 404 in the second light emitting device.

In a fourth implementation, the display panel 160 includes a plurality of pixels, and each pixel includes a first light emitting device and a second light emitting device; and a shape of the nano antenna layer 404 is a strip, and a length of the nano antenna layer 404 in the first light emitting device is different from a length of the nano antenna layer 404 in the second light emitting device.

In a fifth implementation, the display panel 160 includes a plurality of pixels, and each pixel includes a first light emitting device and a second light emitting device; and a material of the nano antenna layer 404 in the first light emitting device is different from a material of the nano antenna layer 404 in the second light emitting device.

Because a wavelength of the light radiated from the nano antenna layer 404 is related to a wavelength range of the surface plasmon on the surface of the nano antenna layer 404, a length of the nano antenna layer 404, the material of the nano antenna layer 404, and the like, when the wavelength range of the surface plasmon on the surface of the nano antenna layer 404 in the first light emitting device is different from the wavelength range of the surface plasmon on the surface of the nano antenna layer 404 in the second light emitting device, when the length of the nano antenna layer 404 in the first light emitting device is different from the length of the nano antenna layer 404 in the second light emitting device, or when the material of the nano antenna layer 404 in the first light emitting device is different from the material of the nano antenna layer 404 in the second light emitting device, a color of light emitted by the first light emitting device is different from a color of light emitted by the second light emitting device, so that the display panel 160 can implement color display.

The foregoing third, fourth, and fifth methods for controlling the display panel 160 are similar to the foregoing control method for the light emitting element 40. For details, refer to the foregoing control method for the light emitting element 40. Details are not described herein again.

When the light emitting device 40 includes the third electrode layer 406, in some embodiments, as shown in FIG. 14, a plurality of first electrode layers 401 in the light emitting devices 40 in a same column in the display panel 160 are electrically connected, and a plurality of third electrode layers 406 in the light emitting devices 40 located in a same row are electrically connected.

In this case, the plurality of light emitting devices 40 are arranged in rows and columns. Rows or columns may or may not be aligned with each other. In addition, the foregoing "row" and "column" may be exchanged.

During display, the plurality of third electrode layers 406 in the light emitting devices 40 located in a same row are powered on row by row, and whether the light emitting devices 40 that are located in a current row and that are powered on emit light is controlled by powering on or powering off the plurality of first electrode layers 401 in the light emitting devices 40 in each column. In an embodiment, when the plurality of third electrode layers 406 in the light emitting devices 40 in the current row are powered on, if the plurality of first electrode layers 401 in the light emitting devices 40 in a column are powered on, the electroluminescent layer 403 in the light emitting device 40 in the current row in which the column of light emitting devices 40 are located emits photons under effect of the electric field generated between the first electrode layer 401 and the third electrode layer 406. It should be noted that, although only one row is displayed each time, a row-by-row power-on speed is fast, and a light emitting speed of the light emitting device 40 is also fast. Therefore, a complete image can still be seen by human eyes.

When the plurality of first electrode layers 401 in the light emitting devices 40 located in a same column are electrically connected, and the plurality of third electrode layers 406 in the light emitting devices 40 located in a same row are electrically connected, there is no need to separately power on each first electrode layer 401 and each third electrode layer 406. Therefore, a manufacturing process of the display panel 160 can be simplified, and a control process of the first electrode layer 401 and the third electrode layer 406 can be simplified.

In some other embodiments, the plurality of first electrode layers 401 in the display panel 160 are independent of each other, and the plurality of third electrode layers 406 are independent of each other. When a light emitting device 40 needs to emit light, the first electrode layer 401 and the third electrode layer 406 in the light emitting device 40 are powered on, the electroluminescent layer 403 in the light emitting device 40 may emit light under the effect of the electric field generated between the first electrode layer 401 and the third electrode layer 406.

Alternatively, a plurality of first electrode layers 401 in the display panel 160 are electrically connected, and a plurality of third electrode layers 406 are independent of each other. When the plurality of first electrode layers 401 that are electrically connected are powered on, and when a light emitting device 40 needs to emit light, and the third electrode layer 406 in the light emitting device 40 is powered on, the electroluminescent layer 403 in the light emitting device 40 may emit light under the effect of the electric field generated between the first electrode layer 401 and the third electrode layer 406.

When the plurality of first electrode layers 401 are independent of each other, or the plurality of third electrode layers 406 are independent of each other, each light emitting device 40 may be separately controlled. Therefore, a control process can be more flexible, and a refresh rate of the display panel 160 can be faster.

When the light emitting device 40 includes the second electrode layer 402, in some embodiments, as shown in FIG. 14, a plurality of first electrode layers 401 in light emitting devices 40 in a same column in the display panel 160 are electrically connected, and a plurality of second electrode layers 402 in the light emitting devices 40 located in a same row are electrically connected.

In this case, that a plurality of second electrode layers 402 in the light emitting devices 40 located in a same row are electrically connected includes: for light emitting devices 40 located in a same row, one or more second electrode layers 402 of any light emitting device 40 are electrically connected to one or more second electrode layers 402 of another light emitting devices 40.

In some examples, for light emitting devices 40 located in a same row, each second electrode layer 402 in the light emitting device 40 is electrically connected to one second electrode layer 402 in the another light emitting devices 40.

FIG. 14 is illustrated by using an example in which the light emitting device 40 includes two second electrode layers 402, and the two second electrode layers are respectively a second electrode layer 402*a* and a second electrode layer 402*b*. For the light emitting devices 40 located in a same row, the second electrode layers 402*a* in all the light emitting devices 40 are electrically connected, and the second electrode layers 402*b* in all the light emitting devices 40 are electrically connected.

During display, the plurality of second electrode layers 402 in the light emitting devices 40 located in a same row are powered on row by row, and color of light emitted by the light emitting devices 40 that are located in a current row and that are powered on is controlled by powering on or powering off the plurality of first electrode layers 401 in the light emitting devices 40 in each column. In an embodiment, when a plurality of second electrode layers 402 in the light emitting devices 40 located in a current row are powered on, if the plurality of first electrode layers 401 in the light emitting devices 40 located in a column are powered on, the tunable nano antenna units 4041 in the light emitting devices 40 located in a current row in which the column of the light emitting devices 40 are located are converted to a metal state under the effect of the electric field generated between the first electrode layer 401 and the second electrode layer 402, so that a length of the effective part in the nano antenna layer 404 can be adjusted, and the color of the light radiated from the nano antenna layer 404 can be adjusted.

When the plurality of first electrode layers 401 in the light emitting devices 40 located in a same column in the display panel 160 are electrically connected, and a plurality of second electrode layers 402 in the light emitting devices 40 located in a same row are electrically connected, there is no need to separately power on each first electrode layer 401 and each second electrode layer 402. Therefore, a manufacturing process of the display panel 160 can be simplified, and a control process of the first electrode layer 401 and the second electrode layer 402 can be simplified.

In some other embodiments, the plurality of first electrode layers 401 in the display panel 160 are independent of each other, and the plurality of second electrode layers 402 are independent of each other. Alternatively, a plurality of first electrode layers 401 in the display panel 160 are electrically connected, and a plurality of second electrode layers 402 are independent of each other. When a light emitting device 40 emits light, the color of the light emitted by the light emitting device 40 may be controlled by powering on the second electrode layer 402 in the light emitting device 40.

When the plurality of second electrode layers 402 are independent of each other, the color of the light emitted by each light emitting device 40 may be separately controlled. Therefore, a control process can be more flexible.

It should be understood that the display panel 160 includes but is not limited to the first light emitting device and the second light emitting device. To implement full-color display, the display panel 160 may further include a third light emitting device, and a color of light emitted by the third light emitting device is different from colors of light emitted by the first light emitting device and the second light emitting device.

It should be noted that the light emitting device 40 may be applied to the display panel 160 to implement display, and may also be applied to another light emitting device to perform lighting and the like.

An embodiment of this application further provides a control apparatus. The control apparatus includes a second processor and a first memory. The first memory stores program code, and when the program code is executed by the second processor, the control method for the light emitting device 40 is implemented, or the control method for the display panel 160 is implemented.

In this case, the control apparatus may be, for example, an FPGA (field programmable gate array).

The foregoing description is a merely implementation of this application, but is not intended to limit the protection scope of this application. Any variation or replacement readily figured out by one of ordinary skilled in the art within the technical scope disclosed in this application shall fall within the protection scope of this application. Therefore, the protection scope of this application shall be subject to the protection scope of the claims.

What is claimed is:

1. A light emitting device, comprising:
   a first electrode layer;
   an electroluminescent layer; and
   a nano antenna layer disposed in sequence, wherein the first electrode layer is configured to enable the electroluminescent layer to generate photons, and
   the nano antenna layer is configured to: when the photons are emitted to a surface of the nano antenna layer and close to the electroluminescent layer, generate a surface plasmon on the surface,
   wherein the nano antenna layer comprises a plurality of nano antenna units arranged in sequence, two adjacent nano antenna units are in contact with each other, and the plurality of nano antenna units comprise a tunable nano antenna unit, and
   the light emitting device further comprises a second electrode layer disposed on a side of the tunable nano antenna unit and far away from the electroluminescent layer.

2. The light emitting device according to claim 1, wherein the tunable nano antenna unit is configured to convert between an insulation state and a metal state under effect of an electric field generated between the first electrode layer and the second electrode layer.

3. The light emitting device according to claim 2, wherein the tunable nano antenna unit is configured to:
   convert to the metal state when electric field strength of the electric field generated between the first electrode layer and the second electrode layer is greater than an electric field threshold; or
   convert to the insulation state when electric field strength of the electric field generated between the first electrode layer and the second electrode layer is less than or equal to an electric field threshold.

4. The light emitting device according to claim 2, wherein the plurality of nano antenna units further comprise a non-tunable nano antenna unit; and
   the tunable nano antenna unit is disposed on one side of the non-tunable nano antenna unit in a first direction, and the tunable nano antenna unit is disposed on the other side of the non-tunable nano antenna unit in a second direction, wherein
   the non-tunable nano antenna unit is in the metal state, and the first direction intersects with the second direction.

5. The light emitting device according to claim 4, wherein the first direction and the second direction are perpendicular to each other.

6. The light emitting device according to claim 4, further comprising:
   a third electrode layer disposed on a side of the electroluminescent layer and far away from the first electrode layer, wherein
   the third electrode layer and the non-tunable nano antenna unit are separately disposed on the electroluminescent layer.

7. The light emitting device according to claim 6, wherein a material of the third electrode layer is the same as a material of the non-tunable nano antenna unit.

8. The light emitting device according to claim 6, wherein the third electrode layer is in contact with the non-tunable nano antenna unit.

9. The light emitting device according to claim 6, wherein the third electrode layer is located on the one side of the non-tunable nano antenna unit in an arrangement direction perpendicular to the plurality of nano antenna units.

10. The light emitting device according to claim 4, further comprising:
    a third electrode layer, wherein
    the third electrode layer is disposed on a side of the non-tunable nano antenna unit and far away from the electroluminescent layer, and the third electrode layer is in contact with the non-tunable nano antenna unit.

11. The light emitting device according to claim 2, wherein the light emitting device further comprises an insulation layer disposed between the tunable nano antenna unit and the second electrode layer.

12. The light emitting device according to claim 2, wherein a material of the tunable nano antenna unit comprises at least one of vanadium dioxide or a germanium antimony tellurium compound.

13. The light emitting device according to claim 1, wherein that the first electrode layer is configured to enable the electroluminescent layer to generate the photons comprises:

the first electrode layer configured to generate an electric field with the nano antenna layer, to enable the electroluminescent layer to generate the photons under effect of the electric field.

14. The light emitting device according to claim 1, wherein the light emitting device further comprises a third electrode layer disposed on a side of the electroluminescent layer and far away from the first electrode layer; and that the first electrode layer is configured to enable the electroluminescent layer to generate photons comprises:

the first electrode layer configured to generate an electric field with the third electrode layer, to enable the electroluminescent layer to generate the photons under effect of the electric field.

15. A method for controlling a light emitting device, comprising:

applying a voltage to a first electrode layer in the light emitting device, wherein the light emitting device comprising:

a first electrode layer;

an electroluminescent layer; and a nano antenna layer disposed in sequence, wherein the first electrode layer is configured to enable the electroluminescent layer to generate photons, and the nano antenna layer is configured to: when the photons are emitted to a surface of the nano antenna layer and close to the electroluminescent layer, generate a surface plasmon on the surface, wherein the nano antenna layer comprises a plurality of nano antenna units arranged in sequence, two adjacent nano antenna units are in contact with each other, and the plurality of nano antenna units comprise a tunable nano antenna unit, and the light emitting device further comprises a second electrode layer disposed on a side of the tunable nano antenna unit and far away from the electroluminescent layer.

16. The method for controlling the light emitting device according to claim 15, further comprising: applying a voltage to a second electrode layer, so that a tunable nano antenna unit located between the first electrode layer and the second electrode layer converts from an insulation state to a metal state under effect of an electric field generated between the first electrode layer and the second electrode layer.

17. The method for controlling the light emitting device according to claim 15, further comprising:

applying a voltage to a third electrode layer, so that the electroluminescent layer located between the first electrode layer and the third electrode layer generates photons under effect of an electric field generated between the first electrode layer and the third electrode layer.

18. A control apparatus, comprising:

a processor, and a memory coupled to the processor to store instructions, which when executed by the processor, cause the processor to perform operations, the operations comprising:

applying a voltage to a first electrode layer in a light emitting device, wherein the light emitting device comprising:

a first electrode layer;

an electroluminescent layer; and a nano antenna layer disposed in sequence, wherein the first electrode layer is configured to enable the electroluminescent layer to generate photons, and the nano antenna layer is configured to: when the photons are emitted to a surface of the nano antenna layer and close to the electroluminescent layer, generate a surface plasmon on the surface, wherein the nano antenna layer comprises a plurality of nano antenna units arranged in sequence, two adjacent nano antenna units are in contact with each other, and the plurality of nano antenna units comprise a tunable nano antenna unit, and the light emitting device further comprises a second electrode layer disposed on a side of the tunable nano antenna unit and far away from the electroluminescent layer.

19. The apparatus according to claim 18, the operations further comprising:

applying a voltage to a second electrode layer, so that the tunable nano antenna unit located between the first electrode layer and the second electrode layer converts from an insulation state to a metal state under effect of an electric field generated between the first electrode layer and the second electrode layer.

20. The apparatus according to claim 18, the operations further comprising:

applying a voltage to a third electrode layer, so that the electroluminescent layer located between the first electrode layer and the third electrode layer generates photons under effect of an electric field generated between the first electrode layer and the third electrode layer.

* * * * *